(12) United States Patent
Melnik et al.

(10) Patent No.: US 8,778,783 B2
(45) Date of Patent: Jul. 15, 2014

(54) METHODS FOR IMPROVED GROWTH OF GROUP III NITRIDE BUFFER LAYERS

(75) Inventors: Yuriy Melnik, San Jose, CA (US); Lu Chen, Cupertino, CA (US); Hidehiro Kojiri, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/469,050

(22) Filed: May 10, 2012

(65) Prior Publication Data

US 2012/0295418 A1 Nov. 22, 2012

Related U.S. Application Data

(60) Provisional application No. 61/488,675, filed on May 20, 2011.

(51) Int. Cl.
*H01L 21/20* (2006.01)
*H01L 21/02* (2006.01)

(52) U.S. Cl.
CPC .............................. *H01L 21/02304* (2013.01)
USPC .......................................... 438/478; 438/504

(58) Field of Classification Search
CPC ............................................... H01L 21/02304
USPC .......... 438/478, 504, 604; 257/189, 615, 745, 257/E21.09
See application file for complete search history.

(56) References Cited

U.S. PATENT DOCUMENTS

| | | | |
|---|---|---|---|
| 5,376,580 A | 12/1994 | Kish et al. | |
| 5,686,738 A | 11/1997 | Moustakas | |
| 5,827,570 A | 10/1998 | Russell | |
| 6,410,172 B1 | 6/2002 | Gilbert | |
| 6,528,394 B1 | 3/2003 | Lee | |
| 6,551,848 B2 | 4/2003 | Kwak et al. | |

(Continued)

FOREIGN PATENT DOCUMENTS

| | | |
|---|---|---|
| EP | 0541373 A2 | 5/1993 |
| JP | 2004-111865 | 4/2004 |
| JP | 2005-347494 | 12/2005 |
| WO | WO-2011/056456 | 5/2011 |

OTHER PUBLICATIONS

Vitaliy Avrutin, Growth of Bulk GaN and AlN: Progress and Challenges, IEEE, vol. 98, No. 7, Jul. 2010, pp. 1302-1315.*

(Continued)

*Primary Examiner* — Ajay K Arora
(74) *Attorney, Agent, or Firm* — Blakely, Sokoloff, Taylor & Zafman LLP

(57) ABSTRACT

Methods are disclosed for growing high crystal quality group III-nitride epitaxial layers with advanced multiple buffer layer techniques. In an embodiment, a method includes forming group III-nitride buffer layers that contain aluminum on suitable substrate in a processing chamber of a hydride vapor phase epitaxy processing system. A hydrogen halide or halogen gas is flowing into the growth zone during deposition of buffer layers to suppress homogeneous particle formation. Some combinations of low temperature buffers that contain aluminum (e.g., AlN, AlGaN) and high temperature buffers that contain aluminum (e.g., AlN, AlGaN) may be used to improve crystal quality and morphology of subsequently grown group III-nitride epitaxial layers. The buffer may be deposited on the substrate, or on the surface of another buffer. The additional buffer layers may be added as interlayers in group III-nitride layers (e.g., GaN, AlGaN, AlN).

17 Claims, 11 Drawing Sheets

(56) References Cited

U.S. PATENT DOCUMENTS

| | | | |
|---|---|---|---|
| 6,676,751 B2* | 1/2004 | Solomon et al. | 117/84 |
| 6,692,568 B2 | 2/2004 | Cuomo et al. | |
| 7,368,368 B2 | 5/2008 | Emerson | |
| 7,585,769 B2* | 9/2009 | Bour et al. | 438/681 |
| 7,611,915 B2 | 11/2009 | Slater, Jr. et al. | |
| 7,838,315 B2 | 11/2010 | Yang et al. | |
| 7,875,535 B2* | 1/2011 | Kikkawa et al. | 438/493 |
| 7,897,490 B2* | 3/2011 | Preble et al. | 438/478 |
| 7,935,382 B2 | 5/2011 | Park et al. | |
| 7,943,485 B2* | 5/2011 | Francis et al. | 438/458 |
| 8,080,466 B2* | 12/2011 | Su et al. | 438/478 |
| 2004/0115917 A1 | 6/2004 | Shibata et al. | |
| 2006/0008941 A1 | 1/2006 | Haskell et al. | |
| 2006/0051554 A1 | 3/2006 | Kumakura et al. | |
| 2006/0246614 A1* | 11/2006 | Suh | 438/22 |
| 2007/0259502 A1 | 11/2007 | Bour et al. | |
| 2008/0083970 A1 | 4/2008 | Kamber et al. | |
| 2009/0149008 A1 | 6/2009 | Kryliouk et al. | |
| 2009/0173951 A1 | 7/2009 | Kikkawa et al. | |
| 2009/0269867 A1 | 10/2009 | Shakuda | |
| 2010/0012948 A1 | 1/2010 | Usikov et al. | |
| 2010/0124261 A1 | 5/2010 | Hart | |
| 2010/0273318 A1 | 10/2010 | Melnik et al. | |
| 2010/0279020 A1 | 11/2010 | Melnik et al. | |
| 2011/0042682 A1 | 2/2011 | Preble et al. | |

OTHER PUBLICATIONS

International Search Report and the Written opinion of the International Searching Authority for PCT/US12/038729, mailed Nov. 28, 2012, 10 pages.
International Search Report and the Written opinion of the International Searching Authority for PCT/US2012/038730, mailed Jan. 28, 2013, 8 pages.
International Search Report and the Written opinion of the International Searching Authority for PCT/US2012/038727, mailed Jan. 10, 2013, 9 pages.
Allerman, A. A., et al., "Growth and design of deep-UV (240-290 nm)light emmitting diodes using AlGaN alloys", *Journal of Crystal Growth* 272 (2004) 15 pages.
Baranov, B., et al., "Epitaxial Growth and Electrical Properties of GaN-AlN Solid Solutions", *Kristall and Technik*, Dec. 27, 1976, 3 pages.
Baranov, B., et al., "Growth and Properties of $Al_xGa_{1-x}N$ Epitaxial Layers", *Phys. Stat. Sol.* (a) 49, Jul. 31, 1978, 8 pages.
Bliss, D. F., et al., "Aluminum Nitride Substrate Growth by Halide Vapor Transport Epitaxy", *Journal of Crystal Growth* 250, (2003), 6 pages.
Cai, D., et al., "Modeling of Gas Phase and Surface Reactions in an Aluminum Nitride Growth System", *Journal of Crystal Growth* 293, Mar. 26, 2006, 10 pages.
Chu, T. L., et al., "Epitaxial Growth of Aluminum Nitride", *Solid-State Electronics*, Pergamon Press 1967, vol. 10. pp. 1023-1027, Great Britain.
Chu, T. L., et al., "The Preparation and Properties of Aluminum Nitride Films", *J. Electrochem. Soc.: Solid-State Science and Technology*, Jul. 1975, 6 pages.
Claudel, A., et al., "Thermodynamic and experimental investigations on the growth of thick aluminum nitride layers by high temperature CVD", *Journal of Crystal Growth*, Mar. 26, 2009, 10 pages.
Dollet, A., et al., "Chemical vapor deposition of polycrystalline AlN films from $AlCl_3$-$NH_3$ mixtures. Analysis and modeling of transport phenomena", *Thin Solid Films 406*, Aug. 17, 2000, 16 pages.
Dwikusuma, Fransiska, "Sapphire Surface preparation and GaN Nucleation by Hydride Vapor Phase Epitaxy", *Dissertation, University fo Wisconsin-Madison*, 2003, 252 pages.

Egashira, Yasuyuki, et al., "Cluster Size Determination in the chemical Vapor Deposition of Aluminum Nitride", *J. Am. Ceram. Soc.*, 77 (8) Mar. 29, 1993, 8 pages.
Eriguchi, Ken-Ichi, et al., "MOVPE-like HVPE of AlN using Solid Aluminum Trichloride Source", *Journal of Crystal Growth 298*, Nov. 22, 2006, 4 pages.
Kumagai, Yoshinao, et al., "Growth of Thick AlN Layers by Hydride Vapor-phase Epitaxy", *Journal of Crystal growth*, www.sciencedirect.com, Apr. 15, 2005, 6 pages.
Lebedev, A. O., et al., "Activation Energy of Aluminum Nitride Deposition from a Chloride-Hydride System", *Russian Journal of Applied Chemistry*, vol. 67, No. 1, Part 2, 1994, 4 pages.
Lebedev, A. O., et al., "Epitaxial growth of aluminum nitride on sapphire using modified chloride-hydride method", *Inst. Phys. Conf. Ser. No. 137: Chapter 4*, 1993, 3 pages.
Melnik, Yu. V., et al., "AlN/GaN and AlGaN/GaN Heterostructures Grown by HVPE on SiC Substraites", *Mat. Res. Soc. Symp. Proc.* vol. 482, (1998) 6 pages.
Melnik, Yu. V., et al., "First AlGaN free-standing wafers", *Mat. Res. Soc. Symp. Proc.* vol. 764, 2003, 6 pages.
Park, Jong-Rok, et al., "Gas-phase synthesis of AlN powders from $AlCl_3$-$NH_3$-$N_2$", *Journal of Materials Science 28* (1993) 8 pages.
Pauleau, Y., et al., "Composition, Kinetics, and Mechanism of Growth of Chemical Vapor-Deposited Aluminum Nitride Films", *J. Electochem. Soc.: Solid-State Science and Technology*, vol. 129, No. 5, pp. 1045-1052.
Pauleau, Y., et al., "Thermodynamics and Kinetics of Chemical Vapor Deposition of Aluminum Nitride Films", *Journal of the Electrochemical Society, Solid-State Science and Technology*, Jul. 1980, 6 pages.
Segal, A. S., et al., "Modeling Analysis of AlN and AlGaN HVPE", *Physica Status Solidi* (c) 6 (2009) S329-S332, 4 pages.
Timoshkin, Alexey Y., et al., "The Chemical Vapor Deposition of Aluminum Nitride; Unusual Cluster Formation in the Gas Phase", *J. Am. Chem. Soc. 1997*, 119, Dec. 3, 1996, 12 pages.
Wang, Moo-Chin, et al., "Effect of process parameters on synthesis of aluminum nitride powder prepared by chemical vapor deposition", *Journal of Materials Science* 36 (2001) 7 pages.
Yim, W. M., et al., "Epitaxially grown AlN and its optical band gap", *J. Appl. Phys.*, vol. 44, No. 1, Jan. 1973, 5 pages.
Yoshioka, Masayuki, et al., "Growth of the AlN nano-pillar crystal films by means of a halide chemical vapor deposition under atmospheric pressure", *Materials Chemistry and Physics 86*, Jan. 19, 2004, 4 pages.
International Preliminary Report on Patentability for PCT/US12/038730, mailed Nov. 28, 2013, 5 pages.
International Preliminary Report on Patentability for PCT/US12/038727, mailed Nov. 28, 2013, 6 pages.
International Preliminary Report on Patentability for PCT/US12/038729, mailed Nov. 28, 2013, 6 pages.
Bugge, F., et al., "Growth Kinetics, Structure and Surface Morphology of AlN/$\alpha$-$A1203$ Epitaxial Layers", *Crystal Research and Technology*, vo. 22, No. 1 (1987) pp. 65-73.
Maruska, H. P., et al., "The Preparation and Properties of Vapor-Depisited Single-Crystal-Line GaN", *Applied Physics Letters*, vol. 15, No. 10, Nov. 15, 1969, 3 pages.
Melnik, Yuriy, et al., "AlN Substrates: Fabrication via Vapor Phase Growth and Characterization", *Phys. Stat. Sol.* (a) 200, No. 1, (2003) pp. 22-25.
Pichugin, I. G., et al., *Tlectrotekh. Inst.*, No. 302 (1982) [in Russian]—pp. 3-6.
Renner, T., "Herstellung der Nitride von Bor, Aluminum, Gallium and Indium nach dem Aufwachsverfahren", *Anorg. Allg. Chem.* 298 (1959) [in German] pp. 22-33.
Tsaregorodtsev, A. M., et al., "AlGaN Films Grown by Chloride-hydride Chemical Vapor Deposition (CH CVD)", *Institute of Physics Conference Series No. 155: Chapter 3* (1997) pp. 243-246.

* cited by examiner

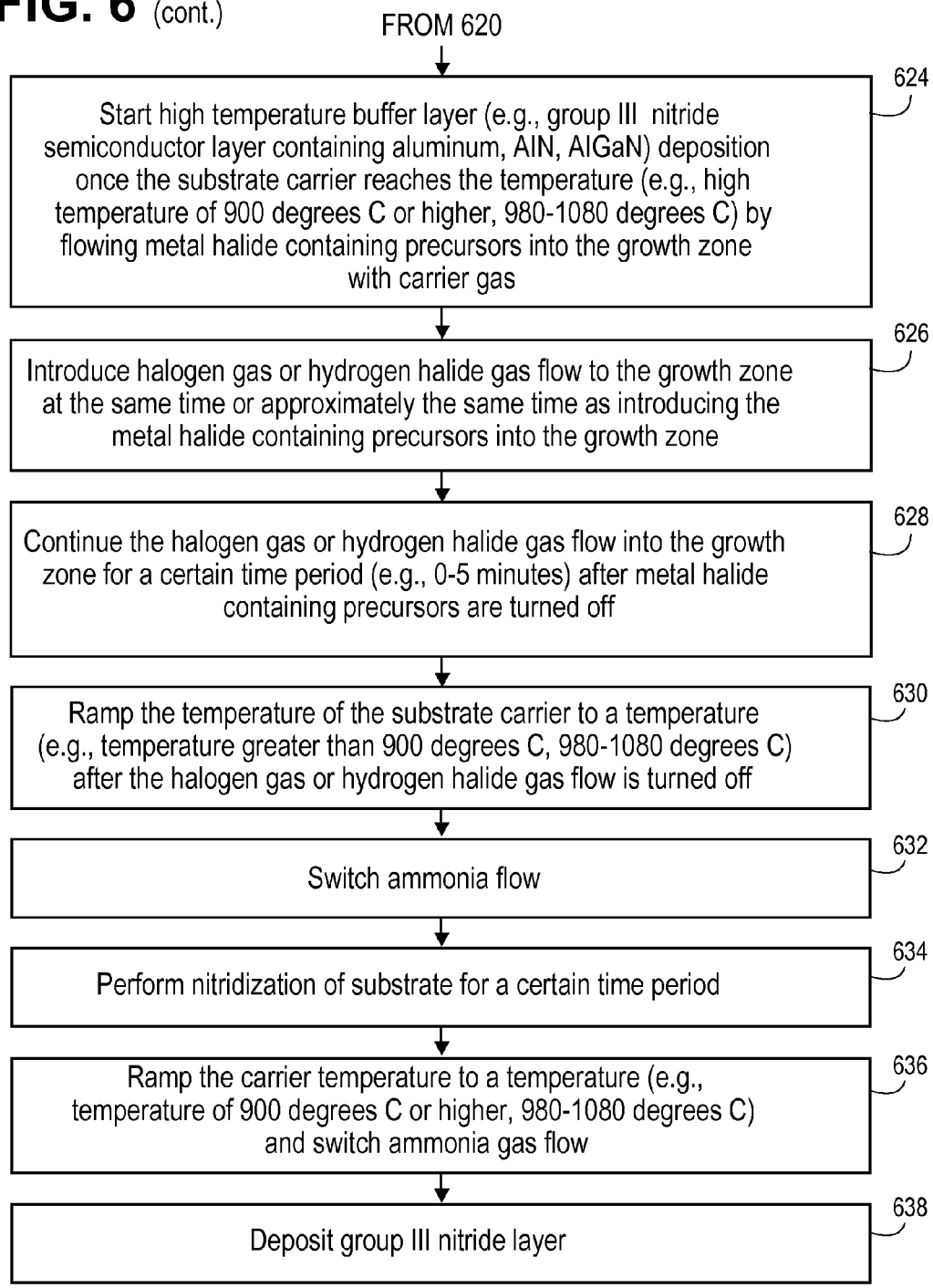

METHODS FOR IMPROVED GROWTH OF GROUP III NITRIDE BUFFER LAYERS

RELATED APPLICATIONS

This application claims the benefit of Provisional Application No. 61/488,675, filed May 20, 2011, which is incorporated herein by reference.

The United States Government has rights in this invention pursuant to Contract No. DE-EE0003331 between the United States Department of Energy and Applied Materials, Inc.

FIELD

Embodiments of this invention relate to methods for improved growth of group III-nitride buffer layers of semiconductors in processing systems.

DESCRIPTION OF RELATED ART

Aluminum (Al) containing III-V compound semiconductors are of significant value since they are used in the fabrication of many electronic devices. The group III-Nitrides GaN, AlN and AlGaN alloys are extremely important materials with widespread applications for optoelectronics (e.g. solid state lighting) and high power electronics. Metal-organic vapor phase epitaxy (MOVPE) is the primary deposition methodology, but hydride vapor phase epitaxy (HVPE) is an alternative epitaxial growth method of group III-nitrides. In general, the HVPE process involves the reaction of one or more metallic halides with a hydride. For the growth of III-nitride materials, typically metallic chlorides and ammonia (NH3) are used.

One challenge with the use of aluminum trihalides in AlN HVPE process is the homogeneous reactions and as a result AlN particles formation in the gas phase. It has been shown that, together with formation of AlN films, some particles are formed in the gas phase. The one-operation overall homogeneous reaction for AlN particles formation is the same as for heterogeneous reaction, but the intermediate reaction paths will be different. The identities of reaction intermediates involved in the homogeneous reactions are usually difficult to be determined experimentally. Generally, if aluminum trihalide and NH3 meet each other, adduct compounds AlRx-NHx type (where x=1-3, and R=Cl, Br, or I) may appear as a result of gas-phase reactions. The simultaneous formation of oligomeric forms is also preferable. The large amounts of the monomers and high-order oligomers in the gas phase finally produce small suspended particles of AlN in the reactor chamber.

When aluminum trichloride (AlCl3) mixes with NH3, they react instantaneously producing AlN nanoparticles in the gas phase. The one-operation overall homogeneous reaction for AlN particles formation follows below.

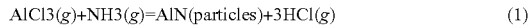
AlCl3(g)+NH3(g)=AlN(particles)+3HCl(g)   (1)

Premature premixing gases at low temperature, large volume of the deposition chamber, and low total gas flow can significantly increase nominal residence time of AlN nanoparticles in the reactor. As a result, the size of AlN particles will be increased. The high residence time and high partial pressure of AlCl3 can lead to visible AlN powder in the gas phase.

AlN particles were directly observed in the AlCl3-NH3-Ar system in the atmospheric hot wall HVPE reactor without any additional optical tools (like in situ laser light scattering) by a prior approach. During the growth process aerosol in reactor is present. It looks like narrow mist-strip located at 2-3 mm away from the reactor walls.

The homogeneous formation of AlN powder in the HVPE process may be explained on the basis of a model suggested by another prior approach. The gas-phase reactions are as following:

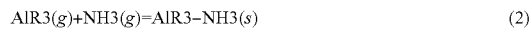
AlR3(g)+NH3(g)=AlR3–NH3(s)   (2)

AlR3–NH3(s)=AlR2–NH2(s)+HR(g)   (3)

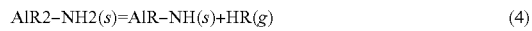
AlR2–NH2(s)=AlR–NH(s)+HR(g)   (4)

AlR–NH(s)=AlN(s)+HR(g),   (5)

where R=Cl, Br, or I.

So, AlN nanoparticles (AlN powder) represent the end product of a chain of gas-phase chemical reactions.

Using AlCl3 and NH3, as the parent species, another approach deposited aluminum nitride in a reactor consisted of a premixing zone (460 degrees C.), a rising-temperature zone (from 460 degrees C. to the reaction temperature), a reaction zone (constant at a temperature ranging from 700 to 1100 degrees C.), and a particle collection zone (600 degrees C.). This approach suggests that the chemical vapor deposition process starts with formation of the adduct molecules AlCl3-(NH3)x, when AlCl3 and NH3 are mixed in the premixing zone of a reactor. These adduct molecules form clusters and AlN particles in the gas phase. The production rates of AlN layers on substrates and AlN particles in the gas phase were independently determined in AlCl3-NH3-He system. Formation of AlN clusters, ranging in size from 0.8 nm (700 degrees C.) to 0.5 nm (1100 degrees C.) was found to be a key process in the rapid growth of AlN.

However, the homogeneous process and AlN particles that form in the gas phase can lead to negative effects on heterogeneous AlN layer deposition. The negative effects include a drop in deposition rate and yield and poor thickness uniformity.

The formation of particles in the gas phase is the possible cause for macro contaminants and other structural defects in the films. The surface roughness can also be dependent on parasitic homogeneous reactions.

Thus, the participation of AlN particles in the surface reaction (dropping on the surface of AlN epitaxial layer) depends heavily on the chamber design and process conditions, i.e. temperature, species concentrations, gas velocity and total pressure. Homogeneous gas phase reactions in AlCl3-NH3 HVPE systems hinder the growth of good quality epitaxial AlN films.

SUMMARY

Methods are disclosed for growing high crystal quality group III-nitride epitaxial layers with advanced multiple buffer layer technique. In an embodiment, a method includes providing a suitable substrate in a processing chamber of a hydride vapor phase epitaxy processing system. The method includes forming group III-nitride buffer layers that contain aluminum by flowing an ammonia gas into a growth zone of the processing chamber, flowing an one or more metal halide containing precursors (wherein at least one is aluminum halide containing precursor) to the growth zone and at the same time flowing additional hydrogen halide or halogen gas into the growth zone of the processing chamber. The additional hydrogen halide or halogen gas that is flowed into the growth zone suppresses homogeneous particle formation during deposition of buffer layers. Some combinations of low temperature buffers that contain aluminum (e.g., AlN, AlGaN) and high temperature buffers that contain aluminum (e.g., AlN, AlGaN) may be used to improve crystal quality and morphology of subsequently grown group III-nitride epitaxial layers.

BRIEF DESCRIPTION OF THE DRAWINGS

Embodiments of the present disclosure is illustrated by way of example, and not by way of limitation, in the figures of the accompanying drawings, in which.

DETAILED DESCRIPTION

Figure 1:
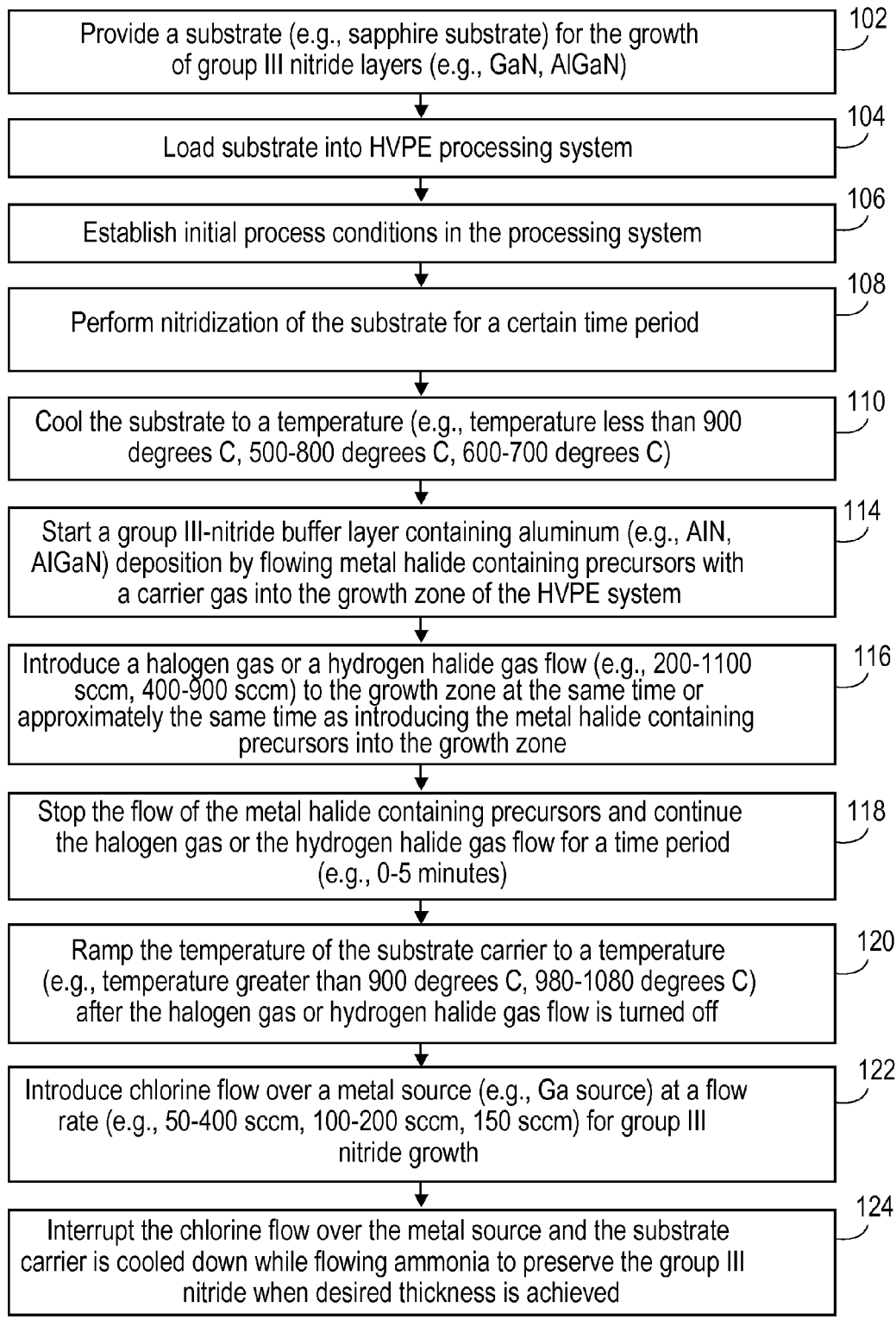
FIG. 1 is a flowchart that illustrates a method for enhancing growth of a high-quality group III-nitride film (e.g., GaN thin film) with a low temperature buffer layer in accordance with one embodiment.

In the following description, numerous details are set forth. It will be apparent, however, to one skilled in the art, that the present disclosure may be practiced without these specific details. In some instances, well-known methods and devices are shown in block diagram form, rather than in detail, to avoid obscuring the present disclosure. Reference throughout this specification to "an embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not mutually exclusive.

In one embodiment, an improved method for growing III-nitride semiconductor epitaxial layers containing aluminum by hydride vapor phase epitaxy (HVPE) is disclosed. In one embodiment, the forming an AlN layer (or Al-containing group III-nitride layer) is conducted by flowing ammonia gas and aluminum halide containing precursor (or at least one aluminum halide containing precursor) into a growth zone of the processing chamber, and at the same time flowing hydrogen halide or halogen gas into the growth zone of the processing chamber. The hydrogen halide or halogen gas that is flowed into the growth zone suppresses homogeneous formation of AlN (or Al-containing group III-nitride) particles. For example, AlN layer may be fabricated on suitable substrate with high quantities of aluminum trichloride (AlCl3) gas and ammonia gas. The method utilizes additional Cl2 gas to suppress homogeneous formation of AlN particles during hydride vapor phase epitaxy of AlN layers. The suppression of homogeneous formation of AlN by introduction of Cl2 gas in the processing chamber during deposition operation essentially improves crystal quality and morphology of the epitaxial layers grown on suitable substrates. As a result of suppression of homogeneous formations, deposition rate of AlN becomes higher, product yield increases, and thickness uniformity improves. In an alternative embodiment, another halogen gases (e.g., bromine (Br2) gas, iodine (I2) gas) may be used for suppression of homogeneous particle formation during deposition of AlN layers (or Al-containing group III-nitride layer).

In one embodiment, the method also enables the growth of Al-containing III-nitride compound semiconductors buffer layers (initial layers, nucleation sites) on suitable substrates for subsequent high quality GaN (or group III-nitride semiconductor) deposition.

A previous approach to grow AlN and AlGaN layers by HVPE with suppression of AlN (or AlGaN) homogeneous formation used HCl as an active gas. Conventional AlN HVPE process (involving aluminum trichloride and ammonia as active gases) starts with formation of the adduct molecules, which form clusters and AlN particles in the gas phase. Introduction of HCl gas in the chamber during deposition operation suppresses homogeneous formation of adduct molecules, clusters and AlN particles. The suppression mechanism includes inhibition and dissolution of homogeneous species after absorption of HCl molecules on the surface of the species.

The use of Cl2 for suppression of AlN (or AlGaN) homogeneous formation has a significant advantage over traditional suppression with HCl due to higher efficiency. The bond energies for HCl and Cl2 are 431 kJ/mol and 243 kJ/mol, correspondingly. The Cl—Cl bond is weakly bound compared to the H-Cl bond. So, a more rapid decomposition of the Cl2 with respect to that of HCl would contribute to the increase in the dissolution rate. The suppression mechanism includes inhibition and dissolution of homogeneous species after absorption of Cl2 molecules on the surface of the species.

This additional Cl2 gas may act also as etchant for epitaxial AlN (or III-nitride semiconductor compounds containing aluminum). To eliminate possible negative effect of etching, an optimal partial concentration of Cl2 and temperature of the deposition have to be defined for each reactor design.

The present disclosure may be used during aluminum containing III-nitride buffers (initial layers) deposition on suitable substrates for subsequent high quality epitaxial GaN (or III-nitride semiconductor) growth. The present disclosure discloses a method of growing AlN (or Al-containing III-nitride) buffers using additional hydrogen halide or halogen gas for suppression of homogeneous particle formation during buffer deposition operation. The crystalline quality of the GaN layers grown on AlN buffers deposited by this method is comparable to (if not superior to) the highest-quality GaN layers grown by MOCVD or HVPE reported in the literature.

In one embodiment, the average deposition time for the buffer deposition operation is not so long (e.g., approximately several minutes), so the efficiency of homogeneous suppression becomes less critical. In this case, additional HCl gas as an alternative to Cl2 gas may be used. The present disclosure discloses a method of growing AlN buffer layers (initial layers, nucleation layers) using additional HCl gas for suppression of homogeneous particle formation during buffer deposition operation. These buffers may be used for subsequent high quality GaN (or III-nitride semiconductor) growth. In an alternative embodiment, another hydrogen halide gases (e.g., hydrogen bromide (HBr) gas, hydrogen iodide (HI) gas) may be used for suppression of homogeneous particle formation during buffer deposition operation In one embodiment, the forming an AlN buffer layer is conducted by flowing ammonia gas and an aluminum halide containing precursor into a growth zone of the processing chamber, and at the same time flowing hydrogen halide or halogen gas into the growth zone of the processing chamber, wherein the hydrogen halide or halogen gas that is flowed into the growth zone suppresses homogeneous formation of AlN particles. The stopping of an aluminum containing precursor flow coming to the processing chamber (or growth zone of the processing chamber) at the same time as stopping hydrogen halide or halogen gas (at the end of forming the AlN buffer layer) is critical for present disclosure performance. The flowing of aluminum halide containing precursor without the hydrogen halide or halogen gas will immediately lead to particles formation. However, the stopping of an aluminum containing precursor flow at the same time as stopping hydrogen halide or halogen gas is limited by the difficulty which originate from aluminum halide gas formation (usually metallic Al reacts with HCl or Cl2 in separate zone upstream of the reactor). In one embodiment, the flow of the aluminum halide containing precursor is stopped while the halogen gas and ammonia are continuing to flow into the growth zone of the processing chamber for a time period. After the flow of metal halide containing precursor is turned off, the additional hydrogen halide or halogen gas flow into the growth zone continues for a certain time period (e.g., 0-5 minutes) to eliminate possible particle creation. The certain time period (delay time) has to be experimentally defined for each chamber design.

FIG. 1 is a flowchart that illustrates a method for enhancing growth of a high-quality group III-nitride epitaxial layer (e.g., GaN layer) with a low temperature (e.g., temperature less than 900 degrees C., 500-800 degrees C., 600-700 degrees C.) buffer layer containing aluminum in accordance with one embodiment. The method includes growing an in situ low temperature buffer layer (or initial layer, or nucleation layer) containing aluminum (e.g., AlN, AlGaN) on suitable substrate (e.g., sapphire, SiC, Si, AlN). The buffer layer containing aluminum is grown with suppression of homogenous particle formation. Then, a subsequent high temperature group III-nitride (e.g., GaN) deposition occurs in the HVPE processing systems.

In one embodiment, a substrate is provided (e.g., aluminum oxide containing substrate, sapphire substrate, (0001) sapphire substrate) for the growth of group III-nitride layers (e.g., GaN, AlN, AlGaN) at block 102. The substrate is loaded into a HVPE processing system at block 104. Then, initial process conditions are established in the processing system at block 106. These process conditions may include setting the pressure (e.g., 50-800 Torr, 400-500 Torr), setting the nitrogen containing material (e.g, nitrogen gas, nitrous oxide, ammonia, hydrazine, diimide, hydrazoic acid, etc) to a flow rate (e.g., 2-10 standard liters per minute (SLM), 2-4 SLM), and then ramping a substrate carrier temperature to a first temperature (e.g., temperature greater than 900 degrees C., 950-1050 degrees C.). Once the temperature reaches the set point, the substrate is under nitridization for a certain time period (e.g., 5-15 minutes) at block 108. After nitridization, the substrate carrier is cooled down to a second temperature (e.g., temperature less than 900 degrees C., 500-800 degrees, 600-700 degrees C.) at block 110. When the temperature set point is reached, a low temperature group III-nitride buffer layer containing aluminum (e.g., AlN, AlGaN) deposition starts at block 114. The buffer layer is grown while suppressing homogenous particle formation (e.g., AlN, AlGaN) based on flowing a halogen gas (e.g., additional chlorine gas) to the growth zone. Alternatively, a hydrogen halide (e.g., hydrogen chloride (HCl)) gas flows into the growth zone to suppress homogeneous particle formation. The process conditions for the buffer layer deposition may include flowing one or more metal halide precursors (e.g., at least one aluminum halide containing precursor (e.g., AlCl3, AlCl, AlBr, AlBr3, AlI, AlI3, GaCl, GaCl3, etc.)) with a carrier gas into the growth zone of the HVPE system at block 114. An aluminum chloride precursor may be formed by flowing chlorine gas (Cl2) to a metal source (e.g., an aluminum source) located in separate zone (upstream of the deposition zone) at a flow rate and time period (e.g., 10-150 sccm for 30 seconds to 5 minutes). Alternatively, the hydrogen halide (e.g., HCl) gas is flowed over an Al source to form the aluminum chloride precursor at a flow rate and time period (e.g., 20-300 sccm for 30 seconds to 5 minutes). The Al source may be solid and have a temperature from 200 degrees C. to the Al melting point temperature (e.g., about 660 degrees C.). The Al source may be liquid and have a temperature greater than the Al melting point temperature. In another embodiment, a source of liquid Ga is also used to form a gallium chloride precursor (e.g., GaCl, GaCl3) in separate zone upstream of the deposition zone.

At the same or approximately the same time (e.g., 0-1 min before) of the introduction of the metal halide precursors into the growth zone, a halogen gas (e.g., chlorine (Cl2) gas) or a hydrogen halide gas (e.g., hydrogen chloride (HCl) gas) flow is introduced to the growth zone (e.g., 200-1100 sccm, 400-900 sccm) at block 116. After the flow of the metal halide precursors is turned off, the halogen gas or the hydrogen halide gas flow can keep flowing for a time period (e.g., 0-5 minutes) at block 118. The buffer layer is deposited based on the reaction of the ammonia, one or more metal halide precursors, and a halogen gas or a hydrogen halide gas in the growth zone. For example, an AlN buffer layer is deposited based on the reaction of ammonia, aluminum halide containing precursor (e.g., AlCl3, AlCl, AlBr3, AlBr) and chlorine gas (or hydrogen chloride gas) in the growth zone. Alternatively, an AlGaN buffer layer is deposited based on the reaction of ammonia, aluminum halide containing precursor (e.g., AlCl3, AlCl, AlBr3, AlBr), gallium halide containing precursor (e.g. GaCl, GaCl3), and additional chlorine gas (or hydrogen chloride gas) in the growth zone. The additional chlorine gas (or hydrogen chloride gas) in the growth zone suppresses homogeneous particle formation during the buffer deposition operation.

After the halogen gas or a hydrogen halide gas flow is turned off, the substrate carrier temperature starts to ramp to a third temperature (e.g., temperature greater than 900 degrees C., 980-1080 degrees C.) at block 120. During this operation, ammonia flow switches to 1-22 SLM. Once the substrate carrier temperature reaches the third temperature, chlorine (Cl2) gas flow over a metal source (e.g., Ga source) is introduced to a flow rate (e.g., 50-400 sccm) for group III-nitride growth (e.g., GaN growth) at block 122. After a 3-30 minute deposition, when the desired GaN thickness is achieved, the chlorine gas flow over the metal source is interrupted and the substrate carrier is cooled down while flowing ammonia gas to preserve the group III-nitride layer at block 124. In an alternative embodiment, the chlorine (Cl2) gas flow of operations 122 is replaced with hydrogen chloride (HCl) gas flow.

In one embodiment, GaN layers were deposited on in situ low temperature AlN buffers in a vertical 28×2 inch capacity Ga—Al—Cl2-NH3-N2 HVPE system. In the separate Al and Ga source zones, the Cl2 reacted with the metals (Al and Ga) to form AlCl3 and GaCl, respectively. The chlorides were transported by N2 and mixed with ammonia in the growth zone. 1.5 μm and 3 μm thick GaN films have been grown on (0001) sapphire substrates using process conditions described above with a growth rate between 10 and 15 μm/hr. The roughness of the GaN layers is in the range of 2-3 nm. The layer quality has been investigated by X-ray diffraction. The FWHM of reflections (002) and (102) is used to determine the tilt and twist structure of the GaN layer. The FWHM of the co-scan rocking curves for (002) and (102) reflections for 1.5 μm thick GaN layers were in the range of 70-250 arcsec and 350-600 arcsec, respectively. The FWHM of the co-scan rocking curves for (002) and (102) reflections for 2.5 μm thick GaN layers were in the range of 130-300 arcsec and 300-500 arcsec, respectively.

Figure 2:
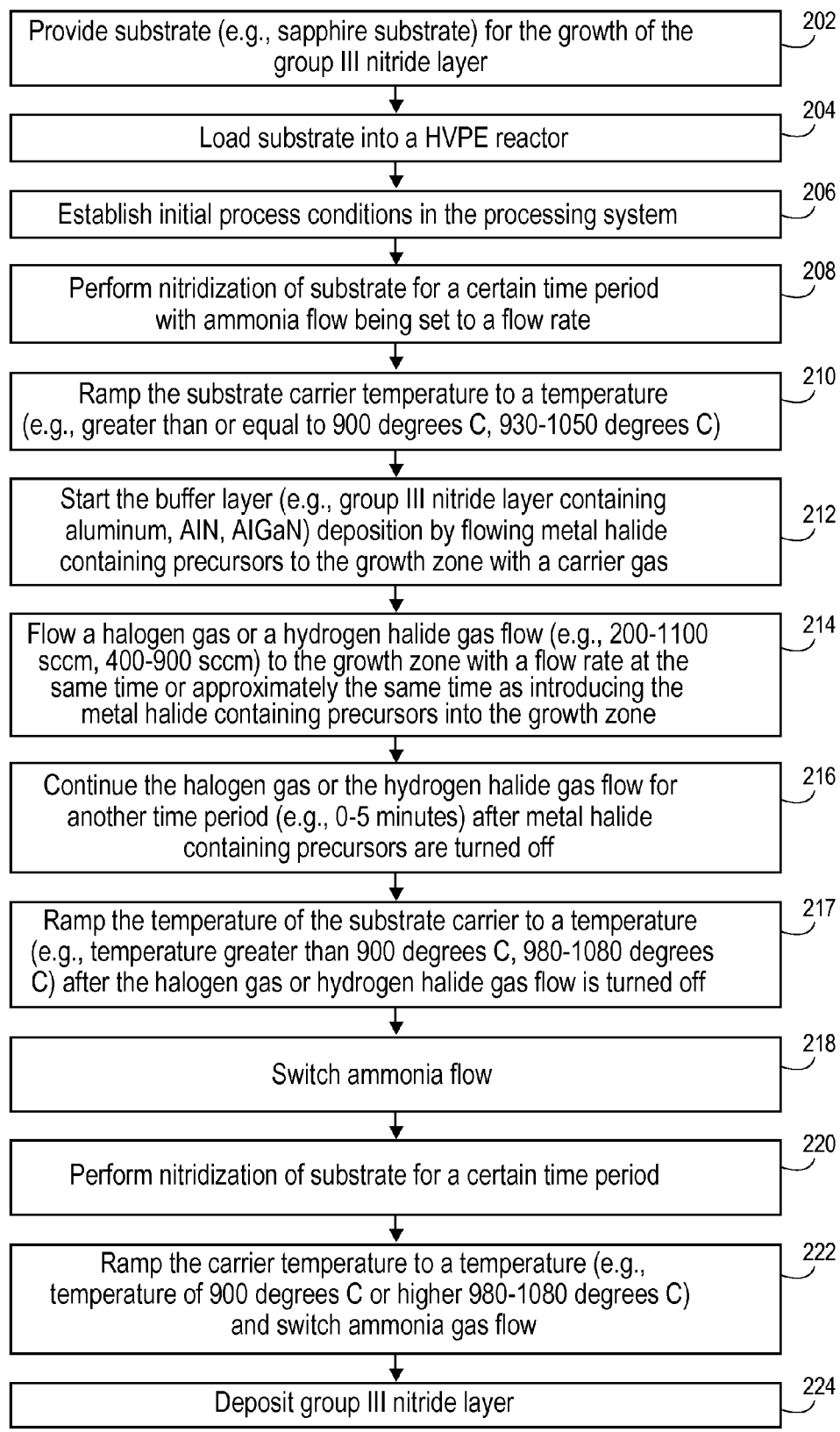
FIG. 2 is a flowchart that illustrates a method for enhancing growth of a high-quality group III-nitride film (e.g., GaN thin film) with a high temperature buffer layer in accordance with one embodiment.

FIG. 2 is a flowchart that illustrates a method for enhancing growth of a high-quality group III-nitride epitaxial layer (e.g., GaN layer) with a high temperature (e.g., 900 degrees C. or higher) buffer layer containing aluminum in accordance with one embodiment. The method includes growing an in situ high temperature buffer layer (or initial layer, or nucleation layer) containing aluminum (e.g., AlN buffer layer) on suitable substrate (e.g., sapphire, SiC, Si, AlN). The buffer layer containing aluminum is grown with suppression of homogenous particle formation. Then, a subsequent high temperature group III-nitride (e.g., GaN) deposition occurs in the HVPE processing systems.

In one embodiment, a high temperature buffer layer or initial layer or nucleation layer (e.g., AlN buffer, AlGaN buffer) is deposited to enhance a subsequent high quality group III-nitride epitaxial layer (e.g., GaN) deposition. A substrate (e.g., aluminum oxide containing substrate, sapphire substrate, (0001) sapphire substrate) is provided for the growth of the group III-nitride layer at block 202. The substrate is loaded into a HVPE reactor at block 204. Then, initial process conditions are established in the processing system at block 206. These process conditions may include setting the pressure (e.g., 50-800 Torr, 400-500 Torr), setting the nitrogen containing material (e.g, nitrogen gas, nitrous oxide, ammonia, hydrazine, diimide, hydrazoic acid, etc) flow to 1-15 SLM, and the ramping a substrate carrier to a first temperature (e.g., temperature greater than or equal to 900 degrees C., 950-1050 degrees C.). Once the temperature reaches the set point, the substrate is under nitridization for a certain time period (e.g., 2-15 minutes) with the ammonia flow being set to a flow rate (e.g., 2-12 SLM) at block 208.

After nitridization, the substrate carrier temperature is ramped (up or down) to a second temperature (e.g., temperature greater than or equal to 900 degrees C., 930-1050 degrees C.) at block 210. In one embodiment, the first temperature is equal to the second temperature. When the temperature set point is reached, a high temperature group III-nitride buffer layer containing aluminum (e.g., AlN, AlGaN) deposition starts at block 212. The buffer layer is grown while suppressing homogenous particle formation based on flowing additional chlorine (Cl2) to the growth zone. Alternatively, hydrogen chloride (HCl) gas flows into the growth zone to suppress homogeneous particle formation. The process conditions for the buffer layer deposition may include flowing one or more metal halide precursors (e.g., at least one aluminum halide containing precursor (e.g., AlCl3, AlCl, AlBr, AlBr3, AlI, AlI3, GaCl, GaCl3, etc.)) with a carrier gas into the growth zone of the HVPE system at block 212. An aluminum chloride precursor may be formed by flowing chlorine gas (Cl2) to an aluminum source located in separate zone upstream of the growth zone (Al source zone of the reactor) at a flow rate and time period (e.g., 10-150 sccm for 30 seconds to 5 minutes). Alternatively, HCl gas is flowed over an Al source to form the aluminum chloride precursor at a flow rate and time period (e.g., 20-300 sccm for 30 seconds to 5 minutes). The Al source may be solid and have a temperature from 200 degrees C. to the Al melting point temperature (e.g., about 660 degrees C.). The Al source may be liquid and have a temperature greater than the Al melting point temperature. In another embodiment, a source of liquid Ga located in separate zone upstream of the reactor (Ga source zone of the reactor) is used to form a gallium chloride precursor (e.g., GaCl, GaCl3).

At the same or approximately the same time (e.g., 0-1 min before) of the introduction of the metal halide precursors into the growth zone, a halogen gas (e.g., chlorine (Cl2) gas) or a hydrogen halide gas (e.g., hydrogen chloride (HCl) gas)flow is introduced to the growth zone (e.g., 200-1100 sccm, 400-900 sccm) at block 214. After the metal halide precursors flow is turned off, the halogen gas or the hydrogen halide gas can keep flowing for a time period (e.g., 0-5 minutes) at block 216 The buffer layer is deposited based on the reaction of the ammonia, one or more metal halide precursors, and a halogen gas or a hydrogen halide gas in the growth zone. For example, AlN buffer layer is deposited based on the reaction of the ammonia, aluminum halide precursor, and chlorine gas (or hydrogen chloride gas) in the growth zone. For example, AlGaN buffer layer is deposited based on the reaction of the ammonia, aluminum halide precursor, gallium halide precursor and chlorine gas (or hydrogen chloride gas) in the growth zone. The halogen gas (e.g., chlorine (Cl2) gas) or a hydrogen halide gas (e.g., hydrogen chloride (HCl) gas) in the growth zone suppresses homogeneous particle formation during the buffer deposition operation.

After the halogen gas or hydrogen halide gas is turned off and the buffer layer formation is completed, the temperature of the substrate carrier ramps to a third temperature (e.g., temperature greater than 900 degrees C., 980-1080 degrees C.) at block 217. Once carrier temperature reaches the third temperature the Ammonia flow switches to a flow rate (e.g., 2-20 SLM, 2-4 SLM) at block 218.

The substrate with buffer layer goes under the second nitridization for a certain time period (e.g., 10 minutes) at block 220. After the nitridization, the carrier temperature ramps to a fourth temperature (e.g., temperature of 900 degrees C. or higher, 980-1080 degrees C.) at block 222. During this operation, ammonia flow switches to 1-22 SLM. Once the substrate carrier temperature reaches the fourth temperature, chlorine (Cl2) gas flow over a metal source (e.g., Ga source) is introduced to a flow rate (e.g., 50-400 sccm) for group III-nitride growth (e.g., GaN growth) at block 224. After a 3-30 minute deposition, when the desired GaN thickness is achieved, the chlorine gas flow over the metal source is interrupted and the substrate carrier is cooled down while flowing ammonia gas to preserve the group III-nitride layer. In an alternative embodiment, the chlorine (Cl2) flow of operation 224 is replaced with hydrogen chloride (HCl) flow.

In one embodiment, 5 μm thick GaN layers have been grown using process conditions described above with a growth rate between 12 and 60 μm/hr. The roughness of the GaN layers is in the range of 2-3 nm. The layer quality has been investigated by X-ray diffraction. The FWHM of reflections (002) and (102) is used to determine the tilt and twist structure of the GaN layer. The FWHM of the ω-scan rocking curves for (002) and (102) reflections for 5 μm thick GaN layers are in the range of 200-300 arcsec and 280-380 arcsec, respectively.

Figure 3A:
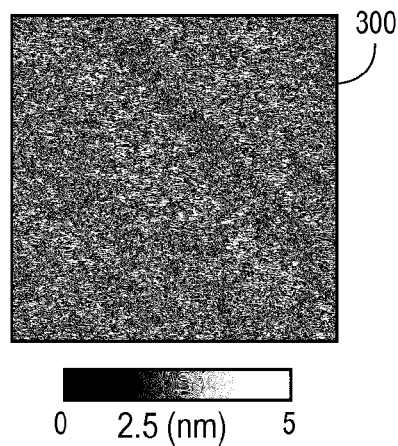
FIG. 3a illustrates an AFM image 300 of a 1 micron by 1 micron sapphire substrate surface.
Figure 3B:
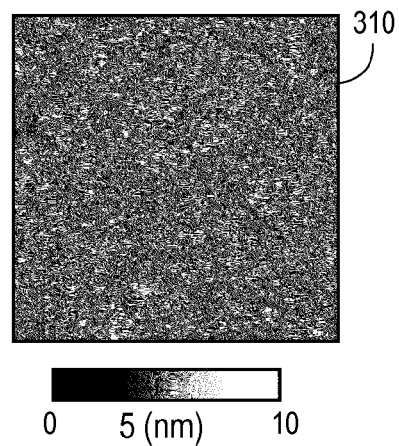
FIGS. 3b-3f illustrate the effect of additional Cl2 flow on a surface morphology of a high temperature AlN buffer layer deposited on the sapphire substrate in accordance with one embodiment.
Figure 3C:
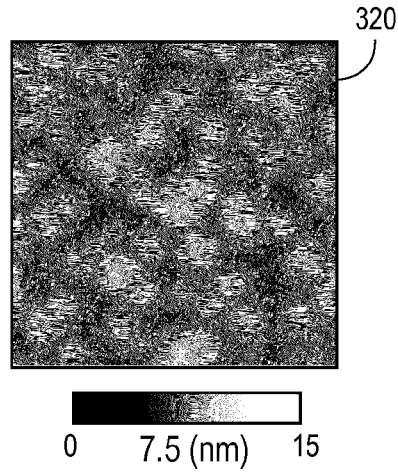
Figure 3D:
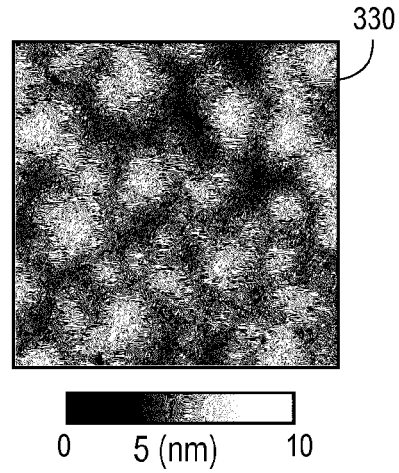
Figure 3E:
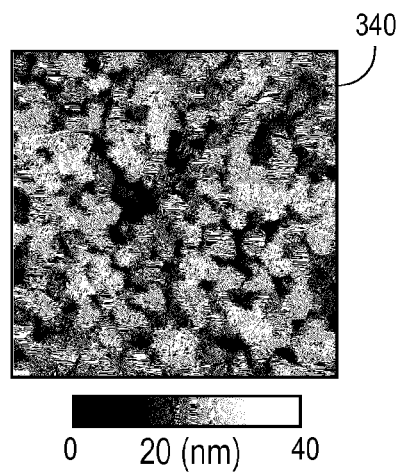
Figure 3F:
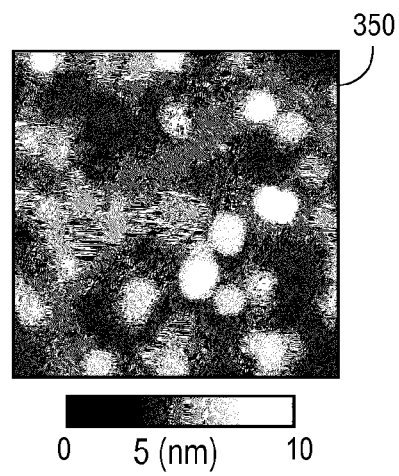

FIG. 3a illustrates an AFM image 300 of a 1 micron by 1 micron sapphire substrate surface. FIGS. 3b-f illustrate the effect of additional Cl2 flow on a surface morphology of a high temperature AlN buffer layer deposited on the sapphire substrate in accordance with one embodiment. These high temperature AlN buffer layers are deposited based on the reaction of the ammonia (NH3) gas, aluminum trichloride (AlCl3) gas, and additional chlorine gas (Cl2) gas in the growth zone. The additional chlorine gas in the growth zone suppresses homogeneous particle formation during the buffer deposition operation. Aluminum trichloride was created by a reaction of Cl2 with solid Al pellets at about 550 degrees C. in the Al source zone of the reactor and delivered to the deposition chamber with N2 carrier gas. FIG. 3b illustrates the AFM image 310 of an AlN buffer layer that was deposited with no additional Cl2 flow in the growth zone. FIG. 3c illustrates the AFM image 320 of an AlN buffer layer that was deposited with an additional Cl2 flow of 100 sccm in the growth zone. FIG. 3d illustrates the AFM image 330 of an AlN buffer layer that was deposited with an additional Cl2 flow of 300 sccm in the growth zone. FIG. 3e illustrates the AFM image 340 of an AlN buffer layer that was deposited with an additional Cl2 flow of 500 sccm in the growth zone. FIG. 3f illustrates the AFM image 350 of an AlN buffer layer that was deposited with an additional Cl2 flow of 800 sccm in the growth zone. The AlN buffer layer becomes thicker with a higher flow of Cl2. The surface becomes rougher with an increasing thickness of AlN buffer.

Figure 4:
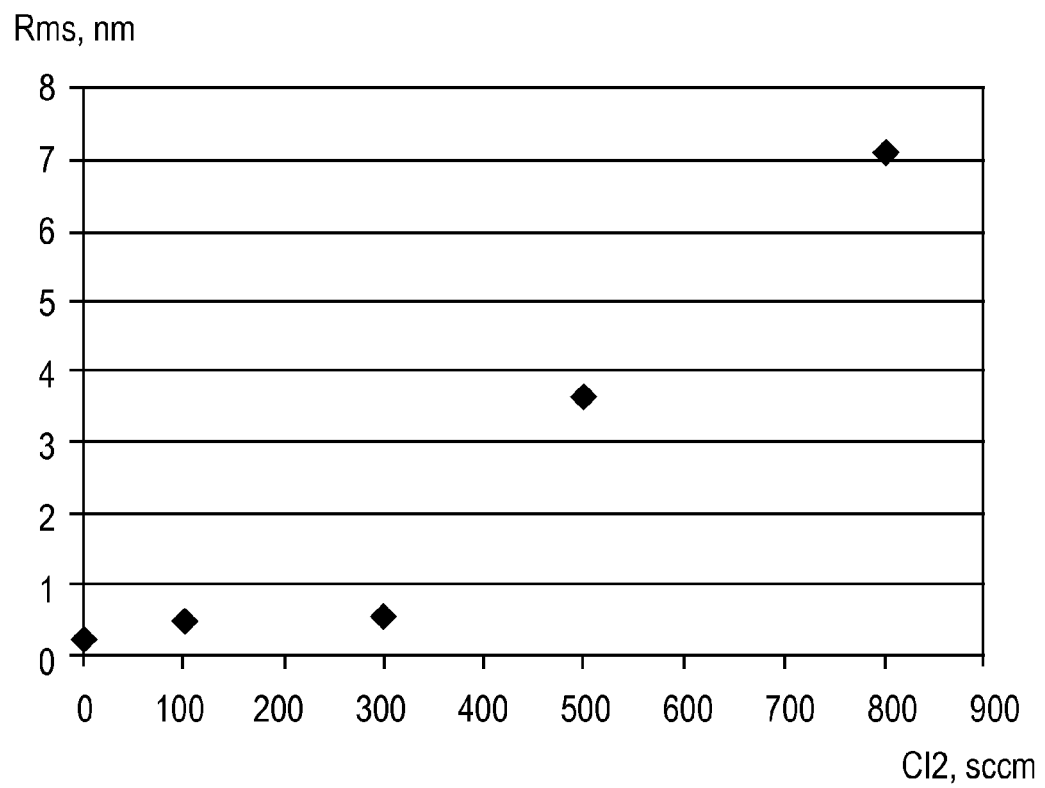
FIG. 4 illustrates the root-mean-square roughness (Rms) in nanometers of high temperature AlN buffers that are deposited on a sapphire substrate at different flows of additional Cl2 during the AlN deposition operation in accordance with one embodiment.

FIG. 4 illustrates the root-mean-square roughness (Rms) in nanometers of high temperature AlN buffers that are deposited on a sapphire substrate at different flows of additional Cl2 during the AlN deposition operation in accordance with one embodiment. The deposition of AlN without additional Cl2 is negligible. The Rms value for a sapphire substrate, which is illustrated in FIG. 3a, is 0.146 nm while the Rms value for AlN without additional Cl2, which is illustrated in FIG. 3b is 0.204 nm. The AlN buffer layer becomes thicker with a higher flow of Cl2. The surface becomes rougher with an increasing thickness of AlN buffer.

The buffer techniques with suppression of homogeneous particles formation described in the present disclosure can be used together to form multi buffer techniques. For example, some combinations of low temperature buffers (e.g., AlN, AlGaN) and high temperature (e.g., AlN, AlGaN) buffers may be used to improve crystal quality and morphology of group III-nitride materials. The multi buffer techniques can also reduce or tune the stress in the subsequently deposited layers and final device structures. The buffer may be deposited on the substrate, or on the surface of another buffer. The additional buffer layers may be added as interlayers in group III-nitride layers (e.g., GaN, AlGaN, AlN).

FIGS. 5a-f illustrate several examples of locations of multiple buffers for GaN deposition on a sapphire structure with a HVPE system in accordance with one embodiment. The device 500 illustrated in FIG. 5a includes a sapphire substrate 502, a high temperature AlN buffer layer 504, a GaN layer 506, a low temperature AlN buffer layer 508, and a GaN layer 509. The device 510 illustrated in FIG. 5b includes a sapphire substrate 512, a low temperature AlN buffer layer 514, a GaN layer 516, a low temperature AlN buffer layer 518, and a GaN layer 519. The device 520 illustrated in FIG. 5c includes a sapphire substrate 522, a low temperature AlN buffer layer 524, a high temperature AlGaN buffer layer 526, and a GaN layer 528. The device 530 illustrated in FIG. 5d includes a sapphire substrate 532, a low temperature AlN buffer layer 534, a high temperature AlN buffer layer 536, and a GaN layer 538. The device 540 illustrated in FIG. 5e includes a sapphire substrate 542, a high temperature AlN buffer layer 544, a high temperature AlGaN buffer layer 546, and a GaN layer 548. The device 510 illustrated in FIG. 5f includes a sapphire substrate 552, a low temperature AlN buffer layer 554, a high temperature AlN buffer layer 556, a high temperature AlGaN buffer layer 558, and a GaN layer 559.

In one embodiment, the devices 500, 510, 520, 530, 540, and 550 include additional layers deposited with the HVPE system or a MOCVD system. For example, the additional layers (to create III-nitride device structure) may include InGaN MQW, p-type AlGaN, and p-type GaN. The additional layers may include n-type AlGaN, InGaN, InGaN/GaN MQW, GaN, p-type AlGaN, and p-type GaN. In other embodiments, the sapphire substrate may be replaced with a silicon substrate, a SiC substrate, lithium aluminum oxide, lithium gallium oxide, zinc oxide, GaN, AlN, quartz, glass, GaAs, spinel, any combination thereof, any mixture thereof, or any alloy thereof.

For a single chamber process, layers of differing composition are grown successively as different operations of a growth recipe executed within the single chamber. For a multiple chamber process, layers in III-nitride device structure (e.g., LED, LD) are grown in a sequence of separate chambers. For example, an undoped/nGaN layer or the layers illustrated in FIG. 5a-5f may be grown in a first chamber, a MQW structure grown in a second chamber, and a p-type GaN layer or p-type AlGaN grown in a third chamber.

Figure 5A:
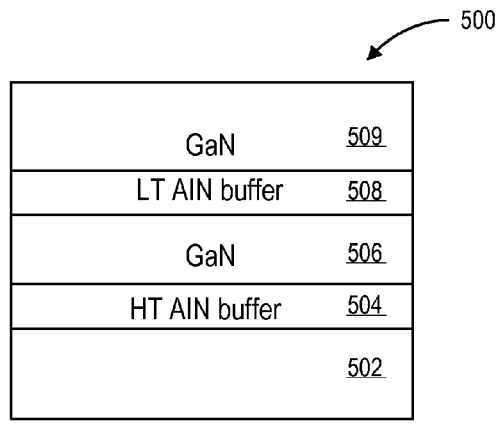
FIGS. 5a-5f illustrate several examples of locations of multiple buffers for GaN deposition on a sapphire structure with a HVPE system in accordance with one embodiment.
Figure 5B:
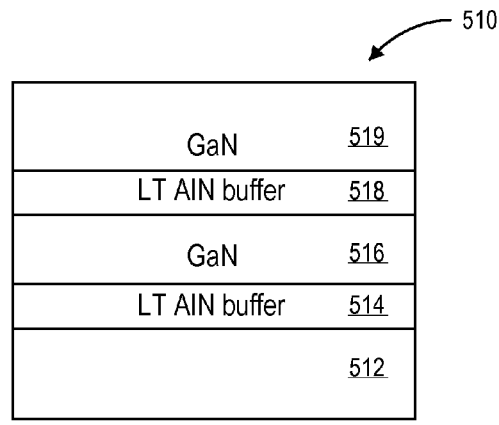
Figure 5C:
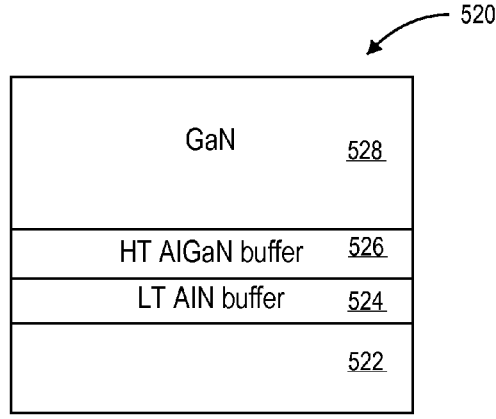
Figure 5D:
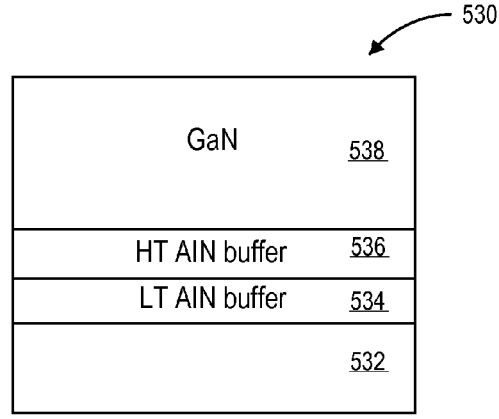
Figure 5E:
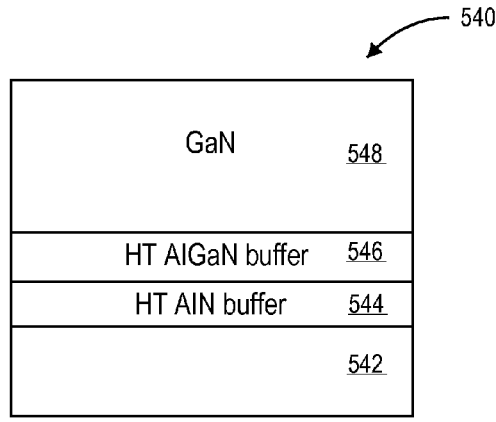
Figure 5F:
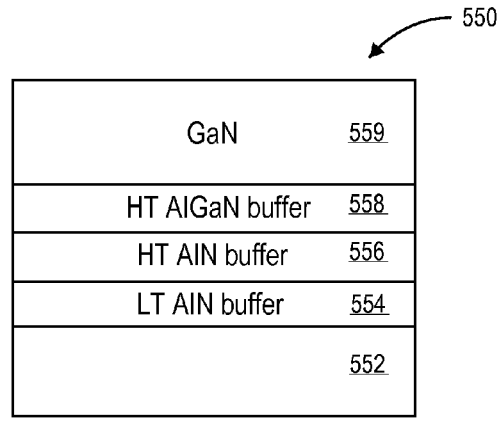
Figure 6:
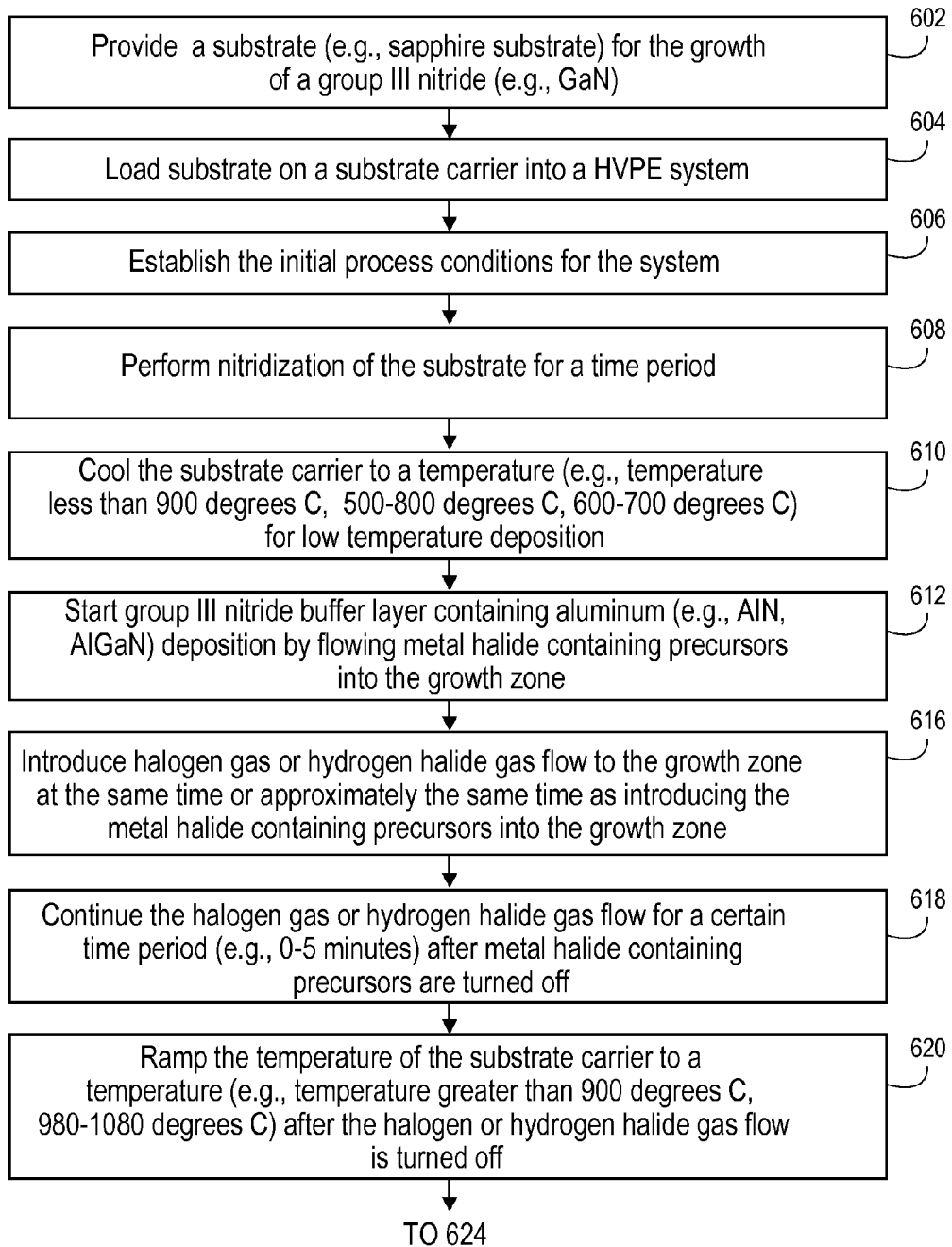
FIG. 6 illustrates a method for enhancing growth of a high-quality group III-nitride (e.g., GaN, AlGaN) layers with multiple buffer layers grown in a HVPE system in accordance with one embodiment.

FIG. 6 illustrates a method for enhancing growth of a high-quality group III-nitride (e.g., GaN, AlN, AlGaN) thin layer with multiple buffer layers grown in a HVPE system on a suitable substrate (e.g., aluminum oxide containing substrate, sapphire substrate, (0001) sapphire substrate) in accordance with one embodiment (e.g., as illustrated in FIGS. 5c and 5d). The method includes growing an in situ low temperature group III-nitride initial layer that contains aluminum (e.g., AlN initial layer, AlGaN initial layer) on a substrate. Then, an in situ high temperature group III-nitride buffer layer that contains aluminum (e.g., AlN buffer, AlGaN buffer) is grown on the initial layer. Subsequently, a high temperature high-quality GaN deposition occurs in the HVPE system. The multiple buffer layers are grown while suppressing homogeneous particle formation.

At block 602, a substrate (e.g., sapphire substrate) is provided for the growth of a group III-nitride (e.g., GaN, AlN, AlGaN). At block 604, the substrate is loaded on a substrate carrier into a HVPE system. Then, the initial process conditions for the system are established at block 606. The process conditions may include setting the pressure (e.g., 50-800 Torr, 400-450 Torr), setting the nitrogen containing material (e.g., nitrogen gas, nitrous oxide, ammonia, hydrazine, diimide, hydrazoic acid, etc) to a flow rate (e.g., 2-10 SLM, 2-4 SLM), and ramping the substrate carrier temperature to a first temperature (e.g., temperature greater than 900 degrees C., 950-1050 degrees C.). Once the temperature reaches the set point, the substrate is under nitridization for a time period (e.g., 5-15 minutes) at block 608. After nitridization, the substrate carrier is cooled down to a second temperature (e.g., temperature less than 900 degrees C., 500-800 degrees C., 600-700 degrees C.) at block 610 for low temperature deposition.

When the temperature set point is reached, a low temperature group III-nitride buffer layer containing aluminum (e.g., AlN, AlGaN) deposition starts at block 612. The initial layer is grown while suppressing homogenous particle formation (e.g., AlN, AlGaN) based on flowing a halogen gas (e.g., additional chlorine) or a hydrogen halide (e.g., additional HCl gas) to the growth zone. The process conditions for the buffer layer deposition may include flowing one or more metal halide precursors (e.g., at least one aluminum halide containing precursor (e.g., AlCl3, AlCl, AlBr, AlBr3, AlI, AlI3, GaCl, GaCl3, etc.)) with a carrier gas into the growth zone of the HVPE system at block 612. An aluminum chloride precursor may be formed by flowing chlorine gas (Cl2) to a metal source (e.g., an aluminum source) located in separate zone (upstream of the deposition zone) at a flow rate and time period (e.g., 10-150 sccm for 30 seconds to 5 minutes). Alternatively, HCl gas is flowed over an Al source to form the aluminum chloride precursor at a flow rate and time period (e.g., 20-300 sccm for 30 seconds to 5 minutes). The Al source may be solid and have a temperature from 200 degrees C. to the Al melting point temperature (e.g., about 660 degrees C.). The Al source may be liquid and have a temperature greater than the Al melting point temperature. In another embodiment, a source of liquid Ga is also used to form a gallium chloride precursor (e.g., GaCl, GaCl3) in separate zone upstream of the deposition zone.

At the same or approximately the same time (e.g., 0-1 min before) of the introduction of the metal halide precursors into the growth zone, a halogen gas (e.g., chlorine (Cl2) gas) or a hydrogen halide gas (e.g., hydrogen chloride (HCl) gas)flow is introduced to the growth zone (e.g., 200-1100 sccm, 400-900 sccm) at block 616. After the metal halide precursors flow is turned off, the halogen gas or hydrogen halide gas flow can keep flowing for a time period (e.g., 0-5 minutes) at block 618. The initial or buffer layer is deposited based on the reaction of the ammonia, one or more metal halide precursors, and a halogen gas or a hydrogen halide gas in the growth zone.

After the halogen gas or hydrogen halide gas flow is turned off, the temperature of the substrate carrier starts to ramp to a third temperature (e.g., temperature greater than 900 degrees C., 980-1080 degrees C.) at block 620. During this operation, ammonia flow switches to 1-12 SLM. Once the substrate carrier reaches the third temperature, then high temperature group III-nitride buffer layer containing aluminum (e.g., AlN, AlGaN) deposition starts at block 624. The high temperature buffer layer is grown while suppressing homogenous particle formation (e.g., AlN, AlGaN) based on flowing a halogen gas or hydrogen halide gas to the growth zone. The process conditions for the high temperature buffer layer deposition may include flowing one or more metal halide precursors (e.g., at least one aluminum halide containing precursor (e.g., AlCl3, AlCl, AlBr, AlBr3, AlI, AlI3, GaCl, GaCl3, etc.)) with a carrier gas into the growth zone of the HVPE system at block 624. An aluminum chloride precursor may be formed by flowing chlorine gas (Cl2) to a metal source (e.g., an aluminum source) located in separate zone (upstream of the deposition zone) at a flow rate and time period (e.g., 10-150 sccm for 30 seconds to 5 minutes). Alternatively, HCl gas is flowed over an Al source to form the aluminum chloride precursor at a flow rate and time period (e.g., 20-300 sccm for 30 seconds to 5 minutes). The Al source may be solid and have a temperature from 200 degrees C. to the Al melting point temperature (e.g., about 660 degrees C.). The Al source may be liquid and have a temperature greater than the Al melting point temperature. In another embodiment, a source of liquid Ga is also used to form a gallium chloride precursor (e.g., GaCl, GaCl3) in separate zone upstream of the deposition zone.

At the same or approximately the same time (e.g., 0-1 min before) of the introduction of the metal halide precursors into the growth zone, a halogen gas (e.g., chlorine (Cl2) gas) or a hydrogen halide gas (e.g., hydrogen chloride (HCl) gas)flow is introduced to the growth zone (e.g., 200-1100 sccm, 400-900 sccm) at block 626. After the metal halide precursors flow is turned off, the halogen gas or hydrogen halide gas flow can keep flowing for a time period (e.g., 0-5 minutes) at block 628. The high temperature buffer layer is deposited based on the reaction of the ammonia, one or more metal halide precursors, and a halogen gas or hydrogen halide gas in the growth zone.

After the halogen gas or hydrogen halide gas flow is turned off and the buffer layer formation is completed, the temperature of the substrate carrier ramps to a fourth temperature (e.g., temperature greater than 900 degrees C., 980-1080 degrees C.) at block 630. Once carrier temperature reaches the fourth temperature, then the Ammonia flow switches to a flow rate (e.g., 2-20 SLM, 2-4 SLM) at block 632.

The substrate with buffer layer goes under the second nitridization for a certain time period (e.g., 10 minutes) at block 634. After the nitridization, the carrier temperature ramps to a fifth temperature (e.g., temperature of 900 degrees C. or higher, 980-1080 degrees C.) at block 636. During this operation, ammonia flow switches to 1-22 SLM. Once the substrate carrier temperature reaches the fifth temperature, chlorine (Cl2) gas flow over a metal source (e.g., Ga source) is introduced to a flow rate (e.g., 50-400 sccm) for group III-nitride growth (e.g., GaN growth) at block 638. After a 3-30 minute deposition, when the desired GaN thickness is achieved, the chlorine gas flow over the metal source is interrupted and the substrate carrier is cooled down while flowing ammonia gas to preserve the group III-nitride layer. In an alternative embodiment, the chlorine (Cl2) flow of operation 638 is replaced with hydrogen chloride (HCl) flow.

The crystalline quality of the GaN layers grown on sapphire substrates according the present disclosure with group III-nitride buffer layers containing aluminum deposited with suppression of homogeneous particle formation is at least comparable to and likely superior to the highest-quality GaN films grown by MOCVD and HVPE reported in the literature. Typical full widths at half-maximum (FWHM) of X-ray rocking curve measurements for the 5-6 µm thick GaN films grown on a (0001) sapphire according to the present disclosure with combination of low temperature AlN and high temperature AlN buffers (according with FIG. 5*d* scheme) are 90-130 arcsec for the on-axis (002) peak and 230-280 arcsec for the off-axis (102) peak.

Figure 7A:
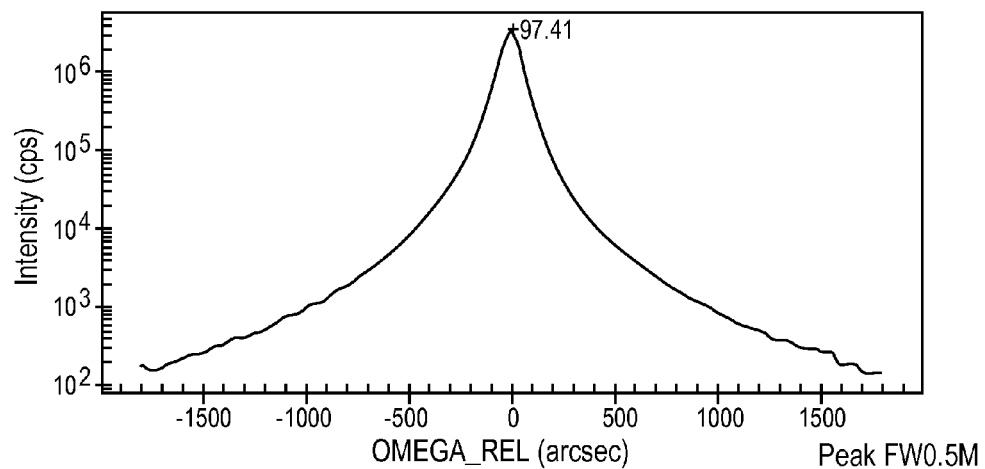
FIG. 7a illustrates an X-ray rocking curve for on-axis (002) peak and FIG. 7b illustrates an X-ray rocking curve for an off-axis (102) peak for 4.8 μm GaN deposited on a (0001) sapphire substrate in accordance with one embodiment.
Figure 7B:
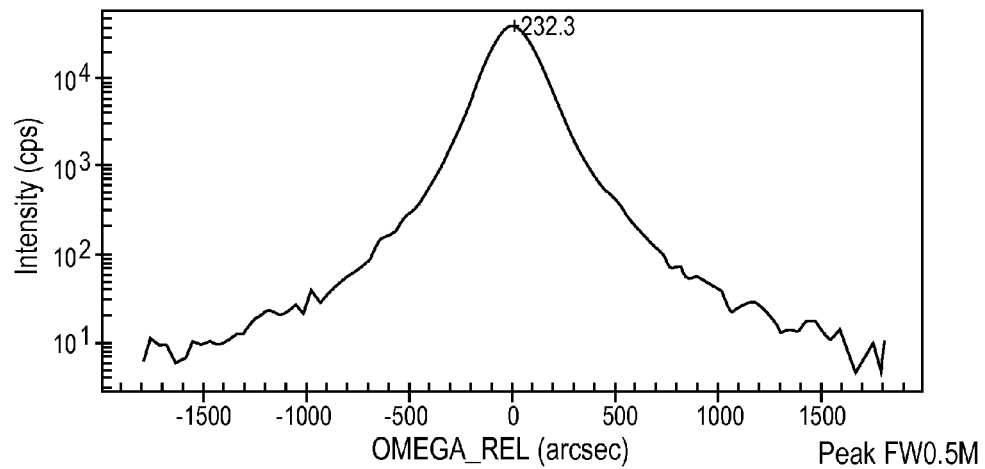

FIG. 7*a* illustrates an X-ray rocking curve for on-axis (002) peak and FIG. 7*b* illustrates an X-ray rocking curve for an off-axis (102) peak for 4.8 µm GaN deposited on a (0001) sapphire substrate in a HVPE system in accordance with one embodiment. The GaN is deposited according to the present disclosure with combination of low temperature AlN and high temperature AlN buffers (according with FIG. 5*d* scheme), which are grown with suppression of homogeneous particles formation by flowing the additional chlorine (Cl2) gas. The low temperature AlN buffer is deposited on (0001) sapphire substrate in a HVPE system.

The reactor conditions will vary by reactor type and design. The three methods described above for FIGS. 1, 2, and 6 show only three sets of conditions that have been found to be useful for the group III-nitride buffer (that contains aluminum) growth with suppression of homogeneous formation and subsequent high quality group III-nitride epitaxial layer deposition. Other conditions may also be useful for such growth.

Note that operations in FIGS. 1, 2, and 6 may be omitted or additional operations may be added as desired. The chamber pressures may be different for nitridation, AlN buffer deposition, AlGaN buffer deposition, and GaN deposition operations. There are other operations that could vary in the growth process. It has been found that nitridization of the substrates and nitridization of the group III-nitride buffer layers that contains aluminum improve surface morphology for some high quality group III-nitride epitaxial layers, and improve crystal quality for other layers. However, this may or may not be necessary for any particular growth technique.

Any carrier gas may be used in this application. Typically carrier gases are nitrogen (N2), hydrogen (H2), argon (Ar) or helium (He), or any combination of these gases.

In one embodiment, the Al-containing group III-nitride buffers of the present disclosure can be used for subsequent growth of any nitride alloy composition and any number of layers or combination thereof, for example, the group III-nitride thin layers may include an alloy composition of (Ga, Al, In, B)N semiconductors having a formula GanAlxInyBzN where $0 \le n \le 1$, $0 \le x \le 1$, $0 \le y \le 1$, $0 \le z \le 1$ and $n+x+y+z=1$.

Dopants, such as Zn, Fe, Si, Ge, and Mg, are frequently doped into nitride layers. The incorporation of these and other dopants not specifically listed is compatible with the practice of this disclosure.

Structural substrates that may be used for embodiments of the invention include, but are not limited to, silicon (Si), silicon carbide (SiC), sapphire or other forms of aluminum oxide (Al2O3), lithium aluminum oxide (LiAlO2), lithium gallium oxide (LiGaO2), zinc oxide (ZnO), gallium nitride (GaN), aluminum nitride (AlN), quartz, glass, gallium arsenide (GaAs), spinel (MgAl2O4), any combination thereof, any mixture thereof, or any alloy thereof. The present disclosure may be used for deposition of AlN (or group III-nitride semiconductor containing aluminum) in any orientation, e.g., semi-polar, non-polar, and polar. So, different orientations of the substrates may be used. The intentional miscut from crystallographic planes of the substrates may be also used to improve the crystal quality and morphology of nitride layers on the substrates. The intentional miscut can be used to initiate the 2D growth mode deposition of nitride layers.

The present disclosure can also be used for depositing group III-nitride layers using any patterned substrates with different patterns geometry. In one embodiment, the patterned substrate is a (0001) patterned sapphire substrate (PSS). Patterned sapphire substrates may be extremely useful in the manufacturing of LEDs and LDs because they increase the light extraction efficiency. Another benefit of using PSS is possible GaN crystal quality improvement.

All CVD epitaxial methods where any aluminum halide and ammonia exist in form of any adduct (ammonia complex of aluminum halides) or separately delivered and mixed just during a deposition operation to create group III-nitride semiconductor layer(s) containing aluminum may be attributed to containing Al HVPE process. The present disclosure is related to Al containing HVPE process.

The aluminum halides contained precursors may be located in the special reactor zone of the HVPE reactor or contained inside the bubbler (e.g., evaporator) which is connected by a delivery line to the HVPE reactor. The aluminum halides contained precursors are maintained at a constant temperature to provide sufficient vapor pressure of the aluminum halide, which is carried into the premixing zone or in the deposition zone by carrier gas.

The aluminum halides may be generated by a chemical reaction of Al located in the special reactor zone with halogen gas or hydrogen halide gas. Any halogen or combination of halogens selected from the group consisting of Cl2, Br2, I2 may be used for reaction with Al to create aluminum monohalides or aluminum trihalides. Any hydrogen halide or combination of hydrogen halides selected from the group consisting of HCl, HBr, HI may be used for reaction with Al to create aluminum monohalides or aluminum trihalides.

A general outline of growth parameters for AlN (or group III-nitride semiconductor crystals containing aluminum) deposition is a pressure between 10 Torr and 1000 Torr, and a temperature between 400 degrees C. and 1400 degrees C. The reactor conditions for group III-nitride semiconductor compounds containing aluminum (e.g., AlN) deposition may vary according to individual reactors design and type of aluminum halide sources (e.g., AlCl3, AlCl3-NH3, AlBr3 or (AlCl3)-nNH3, AlCl).

Figure 8:
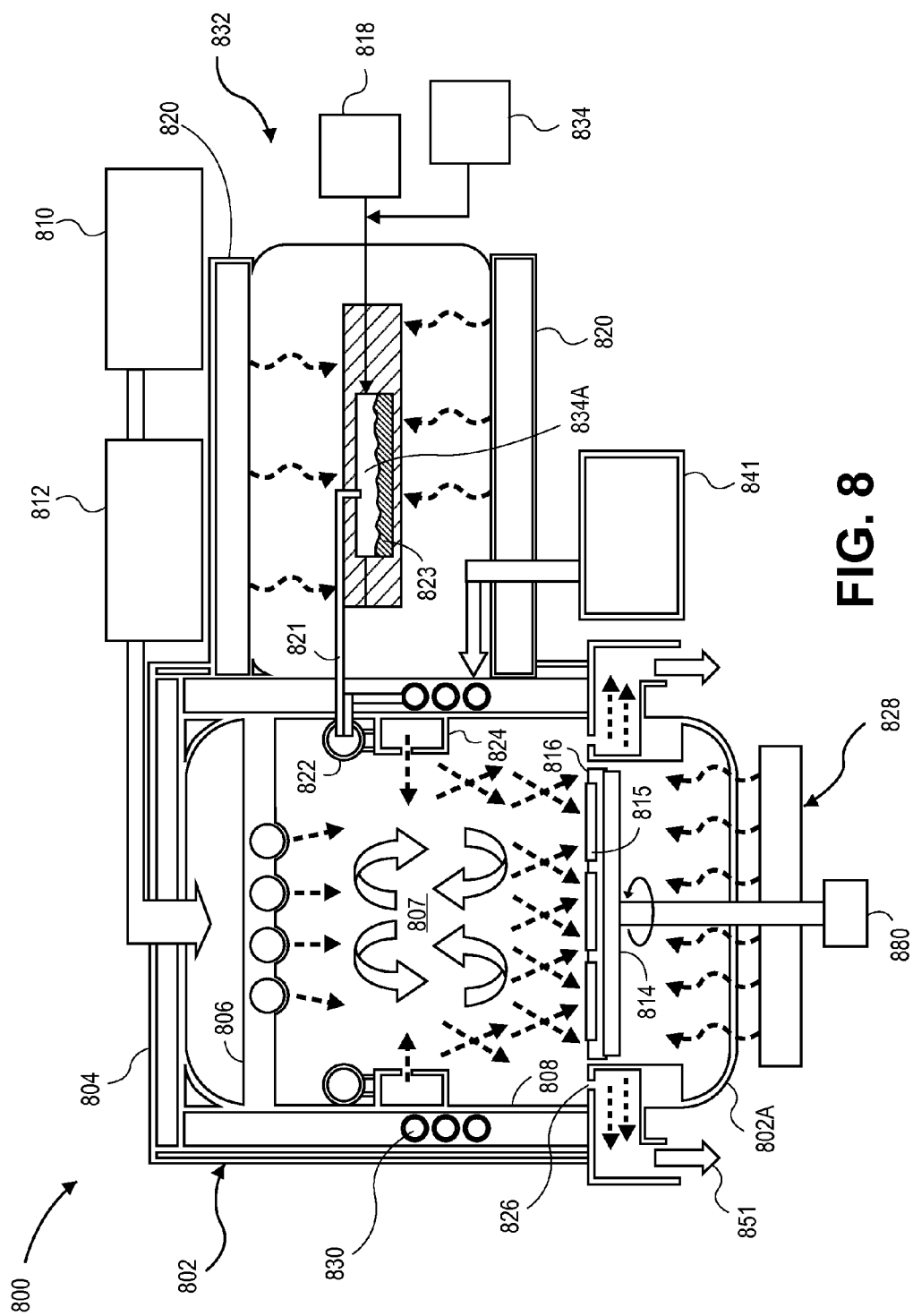
FIG. 8 illustrates an HVPE apparatus in accordance with one embodiment.

FIG. 8 is a schematic sectional view of an HVPE apparatus 800 which can be used to deposit group III-nitride layers (e.g., GaN, AlN, AlGaN, AlON) formed using the processes described herein. The HVPE apparatus 800 includes a chamber 802 enclosed by a lid 804. The chamber 802 and the lid 804 define a processing zone (or growth zone) 807. A showerhead 806 is disposed in an upper region of the processing zone 807. A susceptor 814 is disposed opposing the showerhead 606 in the processing zone 807. The susceptor 814 is configured to support a plurality of substrates 815 thereon during processing. In one embodiment, the substrates 815 are disposed on a substrate carrier 816 which is supported by the susceptor 814. The susceptor 614 may be rotated by a motor 860, and may be formed from a variety of materials, including SiC or SiC-coated graphite.

In one embodiment, the HVPE apparatus 800 includes a heating assembly 828 configured to heat the substrates 815 on the susceptor 814. in one embodiment, chamber bottom 802A is formed from quartz and the heating assembly 828 is a lamp assembly disposed under the chamber bottom 802A to heat the substrates 815 through the quartz chamber bottom 802A, in one embodiment, the heating assembly 828 includes an array of lamps that are distributed to provide a uniform temperature distribution across the substrates, substrate carrier, and/or susceptor.

The HVPE apparatus 800 further includes precursor supplying pipes 822, 824 disposed inside the side wall 808 of the chamber 802. The pipes 822 and 824 are in fluid communication with the processing zone 807 and an net tube 821 found in a precursor source module 832. The showerhead 806 is in fluid communication with the processing zone 807 and a first gas source 810. The processing zone 807 is in fluid communication with an exhaust 851 through an outlet 826.

The HVPE apparatus 800 further includes a heater 830 embedded within the was 808 of the chamber 802. The heater 830 embedded in the walls 808 may provide additional heat if needed during the deposition process. A thermocouple may be used to measure the temperature inside the processing chamber. Output from the thermocouple may be fed back to a controller 841 that controls the temperature of the walls of the chamber 802 by adjusting the power delivered to the heater 830 (e.g., resistive heating elements) based upon the reading from a thermocouple (not shown). For example, if the chamber is too cool, the heater 630 will be turned on. If the chamber is too hot, the heater 830 will be turned off. Additionally, the amount of heat provided from the heater 830 may be controlled so that the amount of heat provided from the heater 830 is minimized.

Processing gas from the first gas source 810 is delivered to the processing zone 807 through the gas distribution showerhead 806. in one embodiment, the first gas source 810 is an ammonia gas source. in one embodiment, the first gas source 810 is configured to deliver a gas that includes ammonia or nitrogen, in one embodiment, an inert gas (e.g., He, Ar, N2) may be introduced as well either through the gas distribution showerhead 606 or through the pipe 624, disposed on the was 808 of the chamber 802. In one embodiment, chlorine gas may be introduced through the pipe 824, disposed on the walls 608 of the chamber 802. An energy source 812 may be disposed between the first gas source 810 and the gas distribution showerhead 806. In one embodiment, the energy source 812 may include a heater or a remote RF plasma source.

The source module 832 includes a halogen or hydrogen halide gas source 818 connected to a well 834A of a source boat and an inert gas source 634 connected to the well 634A. A source material 823, such as aluminum, gallium or indium, is disposed in the well 834A. A heating source 820 surrounds the source boat. An inlet tub 621 connects the well 834A to the processing zone 807 via the pipes 822, 824.

In one embodiment, during processing a halogen gas (e.g., Cl2, Br2 or I2) is delivered from the halogen gas source 818 to the well 834A of the source boat to create a metal halide precursor gas. In one embodiment, during processing a hydrogen halide gas (e.g., HCl, HBr or HI) is delivered from the hydrogen halide gas source 818 to the well 834A of the source boat to create a metal halide precursor gas. The interaction of the halogen gas or hydrogen halide gas and the solid or liquid source material 823 allows a metal halide precursor to be formed. In one embodiment, the metal halide gas is a group III metal halide gas, such as gallium chloride (e.g., GaCl, GaCl3), indium chloride (e.g., InCl3) or aluminum chloride (e.g., AlCl3, AlCl). The source boat may be heated by the heating source 820 to heat the source material 823 and allow the metal halide precursor to be formed. The metal halide precursor is then delivered to the processing zone 807 of the HVPE apparatus 800 through an inlet tube 821. In one embodiment, an inert gas (e.g., Ar, He, N2) delivered from the inert gas source 834 is used to carry, or push, the metal halide precursor formed in the well 834A through the inlet tube 821 and pipes 822 and 824 to the processing zone 807 of the HVPE apparatus 800. An ammonia gas (NH3) may be introduced into the processing zone 607 through the showerhead 606, while the metal halide precursor is also provided to the processing zone 807, so that a group III-nitride layer can be formed on the surface of the substrates 815 disposed in the processing zone 807.

Figure 9:
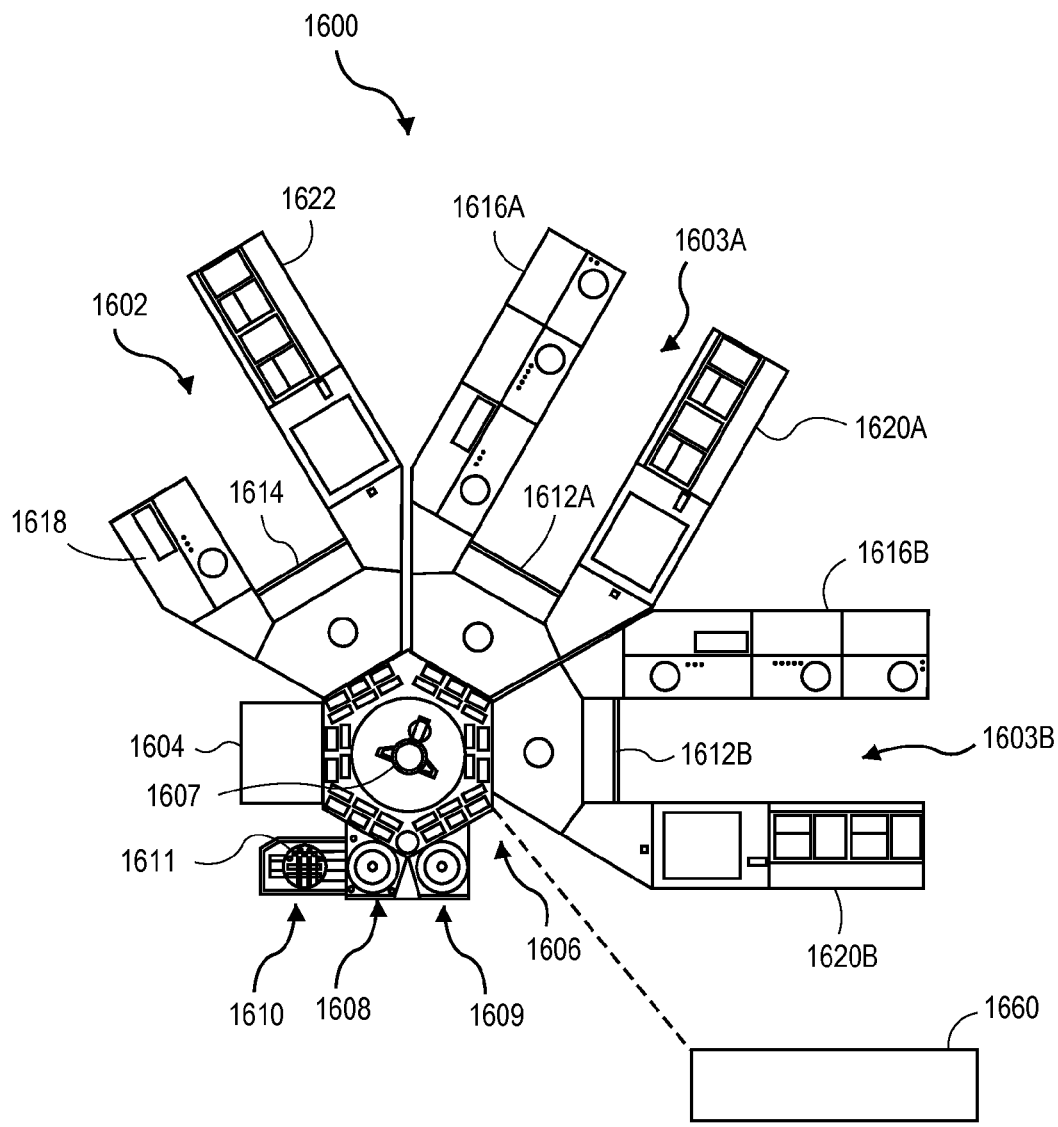
FIG. 9 illustrates a physical structure of a cluster tool schematically in one embodiment.

In another embodiment, one or more substrates may be provided in a one chamber first to form a group III-nitride layer that contains aluminum, and then move to a different chamber within a tool for subsequent processing. FIG. 9 is a cluster tool 900 may be used in a process according to one embodiment of the present disclosure. The cluster tool 900 is configured to form nitride compound structures.

In one embodiment, the cluster tool 1600 includes one HVPE chamber 1602 and multiple MOCVD chambers 1603a and 1603b connected to a transfer chamber 1606 for fabricating compound nitride semiconductor devices according to embodiments described herein. Although one HVPE chamber 1602 and two MOCVD chambers 1603a and 1603b are shown, it should be understood that any combination of one or more MOCVD chambers with one or more HVPE chambers may also be coupled with the transfer chamber 1606. For example, in one embodiment, the cluster tool 1600 may include 3 MOCVD chambers It should also be understood that although a cluster tool is shown, the embodiments described herein may also be performed using a linear processing system.

In one embodiment, an additional chamber 1604 is coupled with the transfer chamber 1606. The additional chamber 1604 may be an MOCVD chamber, an HVPE chamber, a metrology chamber, a degassing chamber, an orientation chamber, a cool down chamber, a pretreatment/preclean chamber, a post-anneal chamber, or the like. In one embodiment, the transfer chamber 1606 is six-sided and hexagonal in shape with six positions for process chamber mounting. In another embodiment, the transfer chamber 1606 may have other shapes and have five, seven, eight, or more sides with a corresponding number of process chamber mounting positions.

The HVPE chamber 1602 is adapted to perform HVPE processes in which gaseous metal halides are used to epitaxially grow layers of compound nitride semiconductor materials on heated substrates. The HVPE chamber 1602 includes a chamber body 1614 where a substrate is placed to undergo processing, a chemical delivery module 1618 from which gas precursors are delivered to the chamber body 1614, and an electrical module 1622 that includes the electrical system for the HVPE chamber of the cluster tool 1600. In one embodiment, the HVPE chamber 1602 may be similar to the HVPE apparatus 600 described in FIG. 7.

Each MOCVD chamber 1603a, 1603b includes a chamber body 1612a, 1612b forming a processing region where a substrate is placed to undergo processing, a chemical delivery module 1616a, 1616b from which gases such as precursors, purge gases, and cleaning gases are delivered to the chamber body 1612a, 1612b and an electrical module 1620a, 1620b for each MOCVD chamber 1603a, 1603b that includes the electrical system for each MOCVD chamber of the cluster tool 1600. Each MOCVD chamber 1603a, 1603b is adapted to perform CVD processes in which metalorganic precursors (e.g., TMG, TMA) react with metal hydride elements to form layers of compound nitride semiconductor materials.

The cluster tool 1600 further includes a robot assembly 1607 housed in the transfer chamber 1606, a load lock chamber 1608 coupled with the transfer chamber 1606, a batch load lock chamber 1609, for storing substrates, coupled with the transfer chamber 1606. The cluster tool 1600 further includes a load station 1610, for loading substrates, coupled with the load lock chamber 1608. The robot assembly 1607 is operable to pick up and transfer substrates between the load lock chamber 1608, the batch load lock chamber 1609, the HVPE chamber 1602, and the MOCVD chambers 1603a, 1603b. In one embodiment, the load station 1610 is an automatic loading station configured to load substrates from cassettes to substrate carriers or to the load lock chamber 1608 directly, and to unload the substrates from substrate carriers or from the load lock chamber 1608 to cassettes.

The transfer chamber 1606 may remain under vacuum and/or at a pressure below atmosphere during the process. The vacuum level of the transfer chamber 1606 may be adjusted to match the vacuum level of corresponding processing chambers. In one embodiment, the transfer chamber 1606 maintains an environment having greater than 90% N2 for substrate transfer. In another embodiment, the transfer chamber 1606 maintains an environment of high purity NH3 for substrate transfer. In one embodiment, the substrate is transferred in an environment having greater than 90% NH3. In another embodiment, the transfer chamber 1606 maintains an environment of high purity H2 for substrate transfer. In one embodiment, the substrate is transferred in an environment having greater than 90% H2.

The cluster tool 1600 further includes a system controller 1660 which controls activities and operating parameters. The system controller 1660 includes a computer processor and a computer-readable memory coupled to the processor. The processor executes system control software, such as a computer program stored in memory.

In one embodiment, one of the processing chamber 1602, 1603*a*, 1603*b*, or 1604 is configured to form a group III-nitride layer that contains aluminum according to methods described above prior to forming device structures. The group III-nitride layer that contains aluminum or several group III-nitride layers deposited on substrates according to methods described above are then transferred to one or more deposition chambers to deposit the subsequent layers used to form the LED or LD structures. In one embodiment, the group III-nitride buffer layer that contains aluminum may be deposited on substrates and/or covered with a III-nitride layers (e.g., undoped GaN layer, n-doped GaN layer) in the HVPE processing chamber 1602, then moved to MOCVD processing chambers 1603*a* or/and 1603*b* for forming group III-nitride layers for the device structure (e.g., n-doped GaN layer, AlGaN layer, MQW structure, p-doped AlGaN layer, p-doped GaN layer). In another embodiment, the group III-nitride buffer layer that contains aluminum may be deposited on substrates in the HVPE processing chamber 1602, then moved to MOCVD processing chambers 1603*a* or/and 1603*b* for forming subsequent layers for the device structure.

Figure 10:
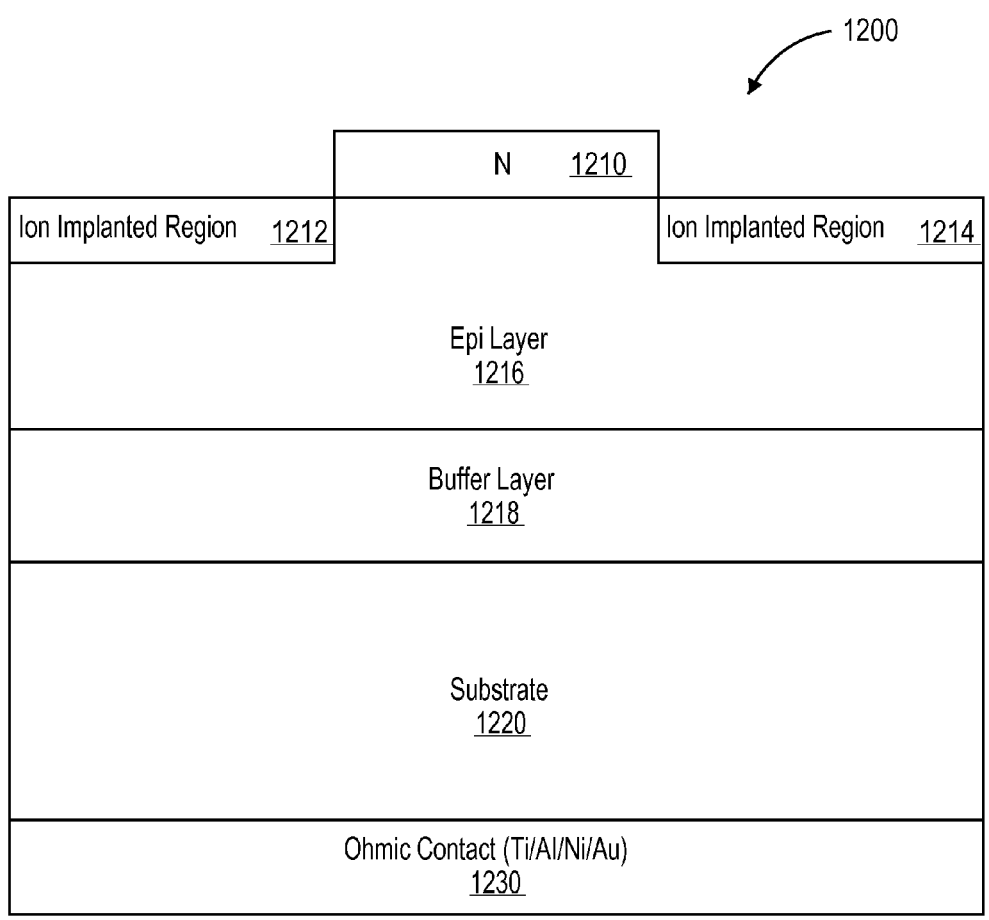
FIG. 10 illustrates a cross-sectional view of a device in accordance with one embodiment.

FIG. 10 illustrates a cross-sectional view of a power electronics device in accordance with one embodiment. The power electronic device 1200 may include an N type region 1210 (e.g., electrode), ion implanted regions 1212 and 1214, an epitaxial layer 1216 (e.g., N type GaN epi layer with a thickness of 4 microns), a buffer layer (e.g., N+ GaN buffer layer with a thickness of 2 microns), a substrate 1220 (e.g., N+ bulk GaN substrate, silicon substrate), and an ohmic contact (e.g., Ti/Al/Ni/Au). The device 1200 may include one or more layers of GaN disposed on a GaN substrate or a silicon substrate. The device (e.g., power IC, power diode, power thyristor, power MOSFET, IGBT, GaN HEMT transistor) may be used for switches or rectifiers in power electronics circuits and modules.

It is to be understood that the above description is intended to be illustrative, and not restrictive. Many other embodiments will be apparent to those of skill in the art upon reading and understanding the above description. Although the present disclosure has been described with reference to specific exemplary embodiments, it will be recognized that the invention is not limited to the embodiments described, but can be practiced with modification and alteration. Accordingly, the specification and drawings are to be regarded in an illustrative sense rather than a restrictive sense.

What is claimed is:

1. A method of depositing multiple buffer layers in a processing chamber of a hydride vapor phase epitaxy processing system, comprising:
providing a substrate in the processing chamber of the hydride vapor phase epitaxy processing system;
forming a first group III nitride buffer layer that contains aluminum by
flowing ammonia gas to a growth zone of the processing chamber,
flowing one or more metal halide containing precursors including at least one aluminum halide containing precursor, and
flowing halogen gas or hydrogen halide gas into the growth zone at the same time; and
forming a second group III nitride buffer layer that contains aluminum over the first buffer layer by
flowing ammonia gas to a growth zone of the processing chamber,
flowing one or more metal halide containing precursors including at least one aluminum halide containing precursor, and
flowing halogen gas or hydrogen halide gas into the growth zone at the same time, wherein the first group III-nitride buffer layer is aluminum nitride (AlN) layer formed at a temperature of approximately 500 to 800 degrees Celsius, the second group III-nitride buffer layer is aluminum nitride (AlN) layer formed at a temperature of 900 degrees Celsius or higher.

2. The method of claim 1, further comprising:
forming a group III-nitride layer over the buffer layers, wherein the first group III nitride buffer layer comprises an initial layer or a nucleation layer.

3. The method of claim 2, wherein the group III-nitride layer is formed by reacting the at least one metal halide containing precursor and ammonia gas.

4. The method of claim 1, wherein the aluminum halide containing precursor comprises an aluminum chloride gas, wherein the hydrogen halide gas comprises a hydrogen chloride (HCl) gas.

5. The method of claim 1, wherein the halogen gas comprises a chlorine (Cl2) gas.

6. The method of claim 1, wherein the halogen gas or hydrogen halide gas that is flowed into the growth zone suppresses homogeneous formation of particles.

7. The method of claim 1, further comprising:
stopping the flow of all metal halide containing precursors while continuing to flow the halogen gas or hydrogen halide gas and ammonia into the growth zone of the processing chamber for a time period.

8. The method of claim 1, wherein the one or more metal halide containing precursors comprise at least one of an aluminum trichloride (AlCl3) precursor, an aluminum monochloride (AlCl) precursor, an aluminum tribromide (AlBr3) precursor, a gallium monochloride (GaCl) precursor, and a gallium trichloride (GaCl3) precursor.

9. The method of claim 1, further comprising:
forming a third group III-nitride buffer layer that contains aluminum over the second buffer layer by flowing ammonia gas to a growth zone of the processing chamber, flowing one or more metal halide containing precursors including at least one aluminum halide containing precursor, and flowing halogen gas or hydrogen halide gas into the growth zone at the same time; and
forming a group III-nitride layer over the third buffer layer.

10. A method, comprising:
providing a substrate in a processing chamber;
forming a first group III-nitride buffer layer that contains aluminum by
flowing ammonia gas to a growth zone of the processing chamber,
flowing one or more metal halide containing precursors, and
flowing halogen gas or hydrogen halide gas into the growth zone at the same time;

forming a first group III-nitride layer over the first buffer layer;

forming a second group III-nitride buffer layer that contains aluminum over the first group III-nitride layer by
flowing ammonia gas to a growth zone of the processing chamber,
flowing one or more metal halide containing precursors, and
flowing halogen gas or hydrogen halide gas into the growth zone at the same time; and forming a second group III-nitride layer over the second group III-nitride buffer layer that contains aluminum, wherein the first group III-nitride buffer layer is aluminum nitride (AlN) layer formed at a temperature of approximately 500 to 800 degrees Celsius, the second group III-nitride buffer layer is aluminum nitride (AlN) layer formed at a temperature of 900 degrees Celsius or higher.

11. The method of claim 10, wherein the first and second group III-nitride layers are formed by reacting the at least one metal halide containing precursor and ammonia gas.

12. The method of claim 10, wherein the one or more metal halide containing precursors include at least one aluminum halide containing precursor, wherein the hydrogen halide gas is a hydrogen chloride (HCl) gas.

13. The method of claim 10, wherein the halogen gas is a chlorine (Cl2) gas.

14. The method of claim 10, wherein the halogen gas or hydrogen halide gas that is flowed into the growth zone suppresses homogeneous formation of particles.

15. The method of claim 10, wherein the substrate is sapphire substrate.

16. The method of claim 10, further comprising:
stopping the flow of all metal halide containing precursors while continuing to flow the halogen gas or hydrogen halide gas and ammonia into the growth zone of the processing chamber for a time period.

17. The method of claim 10, wherein the one or more metal halide containing precursors comprise at least one of an aluminum trichloride (AlCl3) precursor, an aluminum monochloride (AlCl) precursor, an aluminum tribromide (AlBr3) precursor, a gallium monochloride (GaCl) precursor, and a gallium trichloride (GaCl3) precursor.

* * * * *